(12) United States Patent
Edge et al.

(10) Patent No.: US 10,772,240 B2
(45) Date of Patent: *Sep. 8, 2020

(54) DATA CENTRE COOLING SYSTEM

(71) Applicant: Bripco BVBA, Antwerp (BE)

(72) Inventors: Adrian Edge, Cheltenham (GB);
William Thornton, Cheltenham (GB)

(73) Assignee: BRIPCO BVBA, Antwerp (BE)

( * ) Notice: Subject to any disclaimer, the term of this patent is extended or adjusted under 35 U.S.C. 154(b) by 0 days.

This patent is subject to a terminal disclaimer.

(21) Appl. No.: 16/446,260

(22) Filed: Jun. 19, 2019

(65) Prior Publication Data

US 2019/0357391 A1 Nov. 21, 2019

Related U.S. Application Data

(63) Continuation of application No. 15/580,812, filed as application No. PCT/EP2016/064626 on Jun. 23, 2016, now Pat. No. 10,375,862.

(30) Foreign Application Priority Data

Jun. 23, 2015 (GB) .................................. 1511070.3

(51) Int. Cl.
*H05K 7/20* (2006.01)
*H05K 7/14* (2006.01)

(52) U.S. Cl.
CPC ..... *H05K 7/20745* (2013.01); *H05K 7/20145* (2013.01); *H05K 7/1488* (2013.01)

(58) Field of Classification Search
CPC ............ H05K 7/2079; H05K 7/20781; H05K 7/20836; H05K 7/20745; H05K 7/20763; H05K 7/20772; H05K 7/20827; H05K 7/20281; H05K 7/20754; H05K 7/20272; H05K 7/20736; H05K 7/20718; H05K 7/20254; H05K 7/20327; H05K 7/20818; H05K 7/20; H05K 7/20381; H05K 7/20709; H05K 7/1488; H05K 7/20145
See application file for complete search history.

(56) References Cited

U.S. PATENT DOCUMENTS

| | | |
|---|---|---|
| 2,665,840 A | 1/1954 | Powell |
| 4,603,810 A | 8/1986 | Schleimer et al. |
| 4,827,733 A | 5/1989 | Dinh |

(Continued)

*Primary Examiner* — Adam B Dravininkas
(74) *Attorney, Agent, or Firm* — Carlos A. Fisher; Stout, Uxa & Buyan, LLP

(57) ABSTRACT

An air handling unit for a data centre, a data centre comprising such, a method of operating such, and a method of cooling IT equipment in a data centre using such, is disclosed. The unit comprises an external airflow path (102) arranged to be in fluid communication with outside air, a separate internal airflow path (103) arranged to be in fluid communication with inside air, and heat tube panels (106). Preferably, each heat tube panel (106) comprises a heat tube comprising a first section in the external airflow path (102) and a second section in the internal airflow path (103). Preferably, the plurality of heat tube panels (106) is in a row across the internal and external air flow paths (103, 102). Preferably, at least one of the heat tube panels (106) is removable and extends through an opening between the internal and external air flow paths (103, 102).

21 Claims, 22 Drawing Sheets

(i)

(ii)

(iii)

(iv)

(56) References Cited

U.S. PATENT DOCUMENTS

| | | | |
|---|---|---|---|
| 5,024,263 A * | 6/1991 | Laine | F24F 12/006 |
| | | | 165/283 |
| 5,309,732 A | 5/1994 | Sami | |
| 6,155,074 A * | 12/2000 | Jung | F24F 3/044 |
| | | | 62/412 |
| 7,430,118 B1 | 9/2008 | Noteboom et al. | |
| 2005/0225936 A1 | 10/2005 | Day | |
| 2006/0118979 A1 | 6/2006 | Beck et al. | |
| 2006/0250770 A1 | 11/2006 | Campbell et al. | |
| 2006/0260338 A1 * | 11/2006 | VanGilder | G06F 1/20 |
| | | | 62/259.2 |
| 2008/0055846 A1 * | 3/2008 | Clidaras | G06F 1/20 |
| | | | 361/679.41 |
| 2009/0301123 A1 | 12/2009 | Monk et al. | |
| 2009/0326721 A1 | 12/2009 | Sugiyama et al. | |
| 2010/0144265 A1 * | 6/2010 | Bednarcik | H05K 7/20745 |
| | | | 454/184 |
| 2010/0248609 A1 | 9/2010 | Tresh et al. | |
| 2010/0300650 A1 | 12/2010 | Bean, Jr. | |
| 2011/0083824 A1 | 4/2011 | Rogers | |
| 2012/0167610 A1 * | 7/2012 | Dunnavant | F28C 1/14 |
| | | | 62/314 |
| 2012/0171943 A1 | 7/2012 | Dunnavant | |
| 2013/0062047 A1 * | 3/2013 | Vaney | H05K 7/20836 |
| | | | 165/287 |
| 2013/0081784 A1 | 4/2013 | Faig Palomer | |
| 2013/0176675 A1 | 7/2013 | Hundertmark | |
| 2013/0221774 A1 | 8/2013 | Agostini et al. | |
| 2013/0263450 A1 | 10/2013 | Eckberg et al. | |
| 2014/0285965 A1 * | 9/2014 | Keisling | H05K 5/02 |
| | | | 361/679.53 |
| 2015/0034270 A1 * | 2/2015 | Kim | H05K 7/20745 |
| | | | 165/11.1 |

\* cited by examiner (i)

(ii)

(iii)

(iv)

DATA CENTRE COOLING SYSTEM

FIELD OF THE INVENTION

The present invention concerns air handling units for data centres and methods of cooling a data centre. More particularly, but not exclusively, this invention concerns indirect air handling units for use in data centres and methods of cooling a data centre using an indirect air handling unit.

BACKGROUND OF THE INVENTION

A data centre is a late 20th Century development that has grown as a response to the increasing demand for computer processing capability and a recognition of the importance of IT in the place of every business and organisation today. Whereas smaller organisations have sufficient processing power with laptops, PCs and occasionally servers, larger organisations require higher capacity centralised processing to serve a wide range of needs and applications. A few years ago this capacity was supplied by large mainframe computers, but more recently the method used has been to provide data centres comprising many networked computer servers known as blades installed in racks enabling controlled and modular expansion of capacity. The racks also typically house telecommunications equipment such as routers to handle data flow between the computer servers and data flow between the data centre and the outside world.

Data centres can mirror the growth and business activities of successful companies. The growth of a data centre within in an expanding company may typically work as follows:

1. Initially the data centre may start as single rack of servers in an air conditioned room—sometimes referred to as a 'data closet'.

2. As the organisation expands and along with it the number of IT racks employed increases, the closets become 'Server Rooms' or 'IT Rooms'.

3. Eventually the number of racks and size of room expands, often to the point where a dedicated building or part of a building houses the IT. Whilst there is no strict definition of when the size of an IT facility becomes large, or sophisticated, enough to be termed a "data centre", data centres are typically relatively large IT facilities providing robust and resilient IT facilities. Typically, there will be more than 50 servers (often many more) and at least some redundancy in the power supply powering the servers to ensure continuity of service.

4. As the company grows and/or becomes a multi-national organisation additional data centres will be built and sometimes numbers of these will be consolidated into 'Super Data Centres'.

Data centre facilities can require a floor space ranging from a few hundred square feet to a million square feet. The most prevalent size for a small data centre is five to ten thousand square feet with fifty to a hundred thousand square feet being the most common floor area requirement for a large data centre.

As data centres grow, improved methods for efficient cooling of the servers have become more sought after. In air-cooled data centres, servers are typically arranged in rows of racks separated by alternating 'hot' and 'cold' aisles. Cooling air is supplied to the cold aisles, often from an underfloor plenum via perforated floor tiles, and then drawn into the servers in racks adjacent to the cold aisle by internal server fans. The internal fans also exhaust warmed exhaust air into a hot aisle on the other side of the row of racks. In such an arrangement, it is important that the volume of cold air supplied is equal to or greater than that drawn through the servers by their internal fans. If the volume is not sufficient, then the servers can be starved of cooling air or draw in warm air from other areas of the data centre, possibly resulting in the IT equipment overheating. In a traditional data centre in which cooling air is supplied to the cold aisles via an underfloor plenum, it can be difficult to supply the cold aisles with a sufficient volume of cooling air at a given temperature because of the comparatively small cross-sectional area of the underfloor plenum. Furthermore, such underfloor plenums typically have a high air-flow resistance due to their small size, tight corners and the need to force air through perforated floor tiles, thus increasing the amount of energy required to drive air through the system. An approach to overcoming the difficulties of providing large volumes of cooling air through such high-resistance air-flow paths is to provide cooling air at a lower temperature. However, it will be appreciated that providing cooling air at a lower temperature also increases the energy usage of the data centre.

WO2010/139919 and WO2010/139921 (Bripco BVBA) disclose data centres in which cooling air is transported to cold aisles via a corridor at least 1.5 m high, for example a personnel corridor. Entrainment of the cooling air through a corridor having a large cross-sectional area provides a low resistance air flow path enabling large volumes of cooling air to be transported around the data centre at low velocity. Those data centres also make use of 'free-air' cooling, in which air from outside the data centre is used as the cooling air. Throughout most of the year, such data centres can be operated with only adiabatic cooling of outside air, thus avoiding the cost of Direct Expansion, or "mechanical" air cooling required with systems that utilise low temperature cooling air.

A disadvantage of such 'free-air' cooling methods is that the outside air must be carefully filtered and treated to avoid bringing contaminants such as particulates into the data centre, which contaminants may damage the servers. WO2011/148175 (Bripco BVBA) discloses control processes for data centres utilising 'free-air' cooling methods, which processes may comprise a 'smoke detection' system which allows the data centre to switch between modes of operation in which outside air is used as the cooling air and modes in which the cooling air consists entirely of air recirculated from within the data centre. It will be appreciated that such a system is relatively complex to operate and remains vulnerable to ingress of contaminated air if detection equipment is deficient or if the time taken for the system to switch mode is too long. Furthermore, when running in 'full recirculation' mode, the cooling system typically relies on mechanical cooling to reduce the temperature of hot air returning from the servers.

One approach to making use of 'free-air cooling' of a data centre without allowing outside air to come into regular contact with servers is to use a heat exchanger to transfer heat from the warm, recirculated data centre air to cool, outside air. US2010/0300650 (APC) discloses a data centre cooling system comprising an air-to-air heat exchanger in which warm, recirculated air inside the data centre is passed through the inside of a tube as cool outside air is circulated around the outside of the tube. Cooling of the internal recirculated air inside the tube is improved by evaporation of water running over the outside of the tube. A disadvantage of such a system is the relatively high resistance to airflow through the heat exchanger tubes.

US2013/0081784 (AST) discloses a data centre including a passive air-to-air heat exchanger comprising heat tubes. The vertically mounted heat tubes are arranged so that their lower ends are in contact with warm, internal recirculated air from inside the data centre, while their upper ends are in contact with cool, external air drawn through the cooling unit from outside the data centre. The warm, internal air heats the fluid contained in the heat tubes, which evaporates and rises to the top of the tubes, drawing heat out of the internal air. As the cooler, outside air passes over the tops of the heat tubes, the evaporated fluid inside the tubes condenses, releasing heat to the outside air, and the condensed fluid returns to the bottom of the heat tubes. US2015/0034270 (Thermo-Tech) also discloses an air conditioning system for a data centre comprising heat pipes. The air conditioning system includes a sprayer which sprays cooling fluid onto the parts of the heat pipes in contact with the external air to improve the cooling capacity of the system.

A problem associated with known data centre cooling systems using heat exchangers is how to achieve close control of the cooling capacity. It will be appreciated that although it may be desirable to increase the cooling capacity of the heat exchanger by, for example, spraying the parts of the heat exchanger in contact with the external air flow with a fluid (such as water) which evaporates into the external air stream, it is nevertheless costly and inefficient to run such sprayers when they are not needed. Furthermore, introducing substantial quantities of liquid coolant into the system in this way may lead to a degradation of components, for example due to corrosion by the fluid itself or by damage caused by contaminants in the fluid.

The IT industry itself has long recognised the criticality of central computing facilities and the need for energy efficient operations to control cost effectiveness. Current data centre technology is the summation of 30 years of innovation and engineering design thought and has come a long way in recent times. The increasing reliance of organisations of all types on their computing resources has led to data centres often being regarded as 'mission critical' facilities, which must be kept online at all costs. To achieve this, data centres are designed to be resilient, often with redundancy built into the design to ensure that if one component or section fails, another can take its place without interruption of the data centre's operation. For example, a data centre's power supply is typically backed up with emergency batteries and/or generators that automatically cut in in the event of a power cut, and uninterrupted power supply (UPS) systems are provided to cover any time interval between loss of external power and start-up of the backup power source. Each aspect of the power system is itself designed to have built-in redundancy, for example by having the power connection to the external power supply duplicated throughout the data centre, and by providing n+1 batteries/generators and UPS devices where n is the number of such devices required for operation of the data centre (or a particular section of the data centre in larger installations) at full load.

It will be appreciated that a data centre's cooling system should also be resilient, since allowing equipment to overheat can rapidly lead to damage to servers and ultimately to failure of the data centre. One approach to providing resilience in data centre cooling systems is to build redundancy into the design by including n+1 air handling units where only n units are required for operation of the data centre (or a particular section of the data centre in larger installations) at full load. Thus, data centres traditionally comprise more air handling units than required for normal operation. It will be appreciated that such an approach is wasteful, both in terms of the data centre footprint (data centre air handling units are typically large, occupying many hundreds of square feet) and in terms of the cost of duplicating all air handling components. For example, an air handling unit, for example an indirect air handling unit, for cooling 200 kW of IT equipment may have a footprint of around 18 m$^2$ and a height of around 4 m, whereas a similar unit with the capacity to cool 390 kW of IT equipment may have a footprint of around 36 m$^2$. Often, this approach is particularly wasteful because only a limited number of the air handler components are prone to failure or require maintenance.

In traditional, direct free-air cooling data centre air handling units, in which the servers are cooled by direct contact with air from outside the data centre drawn through the air handling unit into the data centre, essential components of the air handling unit (such as fans, filter banks, humidification units and back-up mechanical cooling units) can be duplicated within the handling unit so that if, for example, one fan fails or requires maintenance, other fans are capable of maintaining operation of the cooling unit even when the data centre is at full load.

While a similar approach can be taken with certain components of an indirect air handling units, care must be taken to ensure not only that the air handling unit can meet the cooling requirements of the data centre at full load when one or more components fail or are shut down for maintenance, but also that components can be maintained or repaired without mixing the separate internal and external air streams. The latter requirement is particularly challenging for the heat exchange elements (such as heat tubes) of an indirect air handling unit. It will be appreciated that the heat tubes of an indirect air handling unit are in contact with both the internal air stream and the external air stream. Typically, in order to replace one or more heat tubes if they fail or require off-site maintenance, the air handling unit must be shut down.

The present invention seeks to mitigate one or more of the above-mentioned problems. Alternatively or additionally, the present invention seeks to provide an improved data centre and an improved method of cooling IT equipment in a data centre.

SUMMARY OF THE INVENTION

The present invention provides, according to a first aspect, an indirect air handling unit for a data centre. It may be that the indirect air handling unit is an indirect air optimiser. It will be appreciated that the terms "air handling unit" and "air optimiser" are often used interchangeably in the art. Preferably, the indirect air handling unit comprises:
  i) an external air flow path arranged to be in fluid communication with air outside the data centre; and
  ii) an internal air flow path arranged to be in fluid communication with air inside the data centre;
wherein, the external air flow path is separated from the internal air flow path.

Preferably, the indirect air handling unit comprises:
  a) a plurality of heat tubes, each heat tube having a first section extending into the external air flow path and a second section extending into the internal air flow path; and optionally
  b) at least one humidification means (for example a humidifier) positioned in the external air flow path upstream of the plurality of heat tubes.

Preferably, the humidification means comprises a wetted matrix humidifier.

As used herein, 'free air cooling' of a data centre refers to data centre cooling methods that use ambient air (air from the atmosphere outside of the data centre, 'external air') to extract heat from servers of the data centre. In contrast, the term 'mechanical cooling' of a data centre (for example direct expansion (DX) cooling) refers to methods of data centre cooling that use, for example, compressors and/or pumps to trigger evaporation and condensation of a coolant liquid circulating through coils in contact with air to be cooled. It will be understood that a mechanical cooling means (for example mechanical cooling apparatus) may comprise an evaporator coil for removing heat from the air surrounding it as pressurised working fluid in the coil is allowed to expand and evaporate, and a condenser coil for transferring heat to the air surrounding as working fluid in the coil condenses. Free air cooling methods can, for example, employ direct cooling, in which the cooling air supplied to datacentre IT equipment comprises or consists of ambient air (with optional adjustment of humidity, i.e. adiabatic cooling of the external air), and/or indirect cooling methods, in which the cooling air supplied to the data centre IT equipment is isolated from the external air and cooled instead by contacting it with a heat exchanger which transfers heat from the internal air (i.e. air inside the data centre) to the external air (with optional adjustment of humidity, i.e. adiabatic cooling, of the external air).

As used herein, the term 'Indirect Air Handling Unit' (InDirect Air Handling Unit, IDAHU) refers to an air handling unit that provides conditioned air for cooling IT equipment in the data centre. For example, the IDAHU may provide cooling air having a temperature and humidity falling within pre-determined limits. The IDAHU uses indirect free air cooling to condition the internal air.

It will be understood that when a first component is described as being 'upstream' of a second component, the first component is located at a point along an air flow path at which it comes into contact with air flowing along the air flow path before the air comes into contact with the second component. It follows that a first component described as being 'downstream' of a second component comes into contact with air flowing along the airflow path after the air comes into to contact with the second component.

It will be appreciated that the external air flow path of the IDAHU is the path followed by external air used to extract heat from the data centre. In use, external air may enter the IDAHU through one or more external air inlets, pass along the external air flow path and then exit the IDAHU through one or more external air exhausts. Preferably, external air is drawn and/or pushed along the external air flow path under the control of one or more fans. The one or more fans may be located at any point along the external air flow path. Preferably, the one or more fans are located along the external air flow path downstream of the plurality of heat tubes. It may be that when the one or more fans are located downstream of the plurality heat tubes, the flow of air past the humidification device and over the plurality of heat tubes is less turbulent than when the one or more fans are located upstream of the plurality of heat tubes. It may be that performance of the plurality heat tubes is improved when contacted with air that is less turbulent, for example because of a consistent contact between surfaces of the plurality of heat tubes with external air. It may be that performance of the humidification device, especially a wetted matrix humidifier, is improved when contacted with air that is less turbulent. It may be that the fans operate more efficiently when operating to pull (rather than push) air through the heat tube panels and/or through the wetted matrix humidifier.

It will be appreciated that the internal air flow path of the IDAHU is the path followed by the air circulated within the data centre. In use, warm return air from the servers of the data centre may enter the IDAHU through one or more internal air inlets, pass along the internal air flow path, and then exit the IDAHU through one or more internal air outlets. Internal air exiting the IDAHU is, for example, directed back to the servers as cooling air. Optionally, one or more fans are located along the internal air flow path, the one or more fans being arranged to control the transport of air around the data centre from the servers, through the IDAHU and back to the servers. Alternatively, it may be that the movement of air around the data centre and through the IDAHU is controlled and effected by one or more fans located outside of the IDAHU. For example, it may be that the movement of air around the data centre is substantially controlled and effected by one or more fans located in a different part of the data centre, in which case the internal air flow path may be substantially free of fans. It may be that movement of air around the data centre is substantially controlled and effected by internal fans of the servers in the data centre.

In comparison to free-air cooling air optimisers which directly cool servers with air from outside the data centre building, it may be that the IDAHU provides a lower resistance to internal air flow around the data centre building, for example because fans directing cooling air around the internal 'closed circuit' of air flow within the data centre do not have to draw air in from outside the data centre and force it back out again through exhausts. Furthermore, the isolation of air inside the data centre building from air outside the data centre building may remove the need for high performance air filters along the internal air flow path. It will be appreciated that direct free air cooling methods typically require one or more high performance air filters to remove, for example, particulates such as smoke and/or pollen from the ambient air before it is conditioned and transported to the servers of the data centre. Such high performance filters generally increase the resistance to air flow and thus result in larger, more powerful fans being needed to supply the servers with adequate cooling air in direct free air cooling methods. It will be appreciated that it may be desirable to position one or more filters in the internal air flow path of the IDAHU. However, it may be that only basic filters are used in the internal air flow path that have low air resistance.

It may be that smaller, less powerful fans are required to move air around the data centre when using the IDAHU. The IDAHU may be advantageously combined with a 'Fanless Data Centre' arrangement, such as that disclosed in co-pending application number PCT/EP2016/062018 (Bripco BVBA). The contents of that application are fully incorporated herein by reference. The claims of the present application may incorporate any of the features disclosed in that patent application. For example, it may be that the internal air flow path is substantially free from fans for moving air around the data centre.

It will be appreciated that having the internal air flow path separate from the external air flow path prevents unwanted cross-contamination between air inside the data centre and air outside the data centre. It may be that air outside the data centre is contaminated, for example with particulates such as smoke and/or pollen, such that it is not suitable for use as IT equipment cooling air. For example, it may be that the data centre contains expensive and/or sensitive IT equipment that should not be exposed to external air, even after passing it through a filter.

It will be understood that although the internal and external air flow paths of the IDAHU are described as separate, it may be that the IDAHU includes some means of adding external air to the internal air. For example, the IDAHU preferably comprises one or more controllable vents for adding external air to the internal air. Preferably, the IDAHU comprises one or more filters for filtering external air before its admission into the data centre. It will be appreciated that it may be desirable to admit external air into the data centre to prevent the internal air becoming stale and/or to adjust the humidity of the internal air.

It may be that providing a humidification means in the external air flow path allows the cooling capacity of the external air to be increased by increasing its humidity. It will be appreciated that as compared to direct free air cooling systems, the humidity of the external air can be increased to a high level because the external air is not brought into contact with the IT equipment in the data centre, which equipment is typically sensitive to high humidity levels and/or condensation. It may be that because the cooling capacity of the external air can be raised more using the IDAHU by adiabatic cooling of the ambient air than is possible using direct free air cooling methods, a data centre comprising the IDAHU can be operated using only free air cooling more of the time than a data centre using a direct free air cooling system requiring equivalent cooling capacity.

It may be that using a wetted matrix humidifier as the humidification means provides greater control of the humidity and temperature of the external air that is brought into contact with the heat tubes. It will be appreciated that greater control of the temperature and humidity of the external air provides, in turn, greater control of the operation of the plurality of heat tubes. It will be appreciated that when control of the temperature and humidity of the external air contacted with the heat tubes is more limited, and thus control of the cooling power of the heat tubes is more limited, the IDAHU is typically run at a cautiously high cooling power in order to minimise/eliminate the risk of overheating IT equipment in the data centre, for example due to fluctuation of the cooling power of the IDAHU. For example, in an IDAHU with less control of external air humidity, fans driving external air along the external air flow path may be operated at higher speeds to ensure that fluctuations in cooling capacity caused by variations in external air humidity do not cause the IDAHU to periodically drop below the minimum required cooling capacity.

It may be that the wetted matrix humidifier provides precision adiabatic cooling of the external air, thus avoiding significant fluctuations in the cooling capacity of the IDAHU over a given period. It follows therefore that the IDAHU of the first aspect of the invention may not need to be 'over-run' to counteract the effect of fluctuations in adiabatic cooling of the external air.

Furthermore, it may be that the wetted matrix humidifier is less wasteful of cooling liquid, for example water, than other humidification systems, such as sprayers. Furthermore, it may be that less purification of coolant water is required when using a wetted matrix humidifier in contrast to sprayers which are more susceptible to fouling by salts and/or other substances dissolved in the water.

Preferably, the wetted matrix humidifier comprises a containment device, for example for containing water in the event of a leak. Preferably, the wetted matrix humidifier comprises a bunded base.

It will be appreciated that care should be taken in data centre design to avoid IT equipment in the data centre being brought into contact with excessive levels of moisture. When using water spray humidification systems in a data centre, care must be taken to guard against, for example, leaks and/or ingress of the large volumes of water used by the sprayer system into other parts of the data centre. It may be that the typically lower water usage of a wetted matrix humidifier reduces the likelihood of leaks into other parts of the data centre. Furthermore, it may be that the excess water of the wetted matrix humidifier can be more easily contained and controlled, for example in one or more tanks below the sections of wettable material of the wetted matrix humidifier, than the excess water produced by a spray system which typically collects on the walls, floor and ceiling of a large spray chamber.

A 'heat tube' (or 'heat pipe') is a heat exchanger device that transfers heat between a first section of its surface and a second section of its surface by means of thermal conductivity and phase transition. A heat tube is an elongate sealed hollow body (shell) containing a working fluid. It will be appreciated that a heat tube may comprise a plurality of sections which join together to form a sealed hollow body. At the hot end of the heat tube (i.e. the second section of the heat tube that extends into the internal air flow path), the shell of the heat tube conducts heat from warm air (i.e. warm internal air returning to the IDAHU from the IT equipment in the data centre along the internal air flow path) to the liquid phase working fluid, causing the working fluid to evaporate. As the working fluid evaporates, it circulates to the cold end of the heat tube (i.e. the first section of the heat tube that extends into the external air flow path). At the cold end of the heat tube, the shell of the heat tube conducts heat from the vapour phase working fluid to cooler air (i.e. external air from outside the data centre building) causing the vapour phase working fluid to condense. As the working fluid condenses, it returns to the hot end of the heat tube to begin the cycle again.

It will be appreciated that since a heat tube has no mechanical moving parts (the working fluid circulating within the heat tube by convection), it is a particularly reliable form of heat exchanger. It will also be appreciated that a heat tube, being an elongate body that can be arranged vertically so that the first section projects upwards into the external air flow of the IDAHU above the second section of the heat tube which projects downwards into the internal air flow of the IDAHU, makes efficient use of space. Other forms of heat exchanger, such as heat plates, typically have a larger footprint for a given cooling capacity, often because they require a layout in which the internal and external air flow paths cross over as they pass through the heat exchanger. Furthermore, it may be that a heat exchanger comprising a plurality of heat tubes is more resilient than a heat exchanger comprising a single plate heat exchanger unit. It will be appreciated that failure of a single heat tube in a plurality of heat tubes may allow the heat exchanger to continue to function, whereas a single component plate heat exchanger may provide a vulnerable, single point of failure in an IDAHU.

Preferably, the IDAHU comprises at least one mechanical cooling means (e.g. mechanical cooling apparatus) comprising at least one evaporator section positioned in the internal air flow path. The mechanical cooling means provides the IDAHU with an additional means of cooling the internal air, for example for use in the event that the heat tubes are unable to meet the full cooling requirements of the data centre. Preferably, the mechanical cooling means provides the IDAHU with additional cooling capacity should the ambient air lack adequate cooling capacity and/or should one or more of the plurality of heat tubes fail. Preferably, the mechanical cooling means is configured to control the humidity of the internal air. Preferably, the mechanical cooling means is arranged to transfer heat from the internal air to the ambient air. Preferably, the at least one evaporator section of the mechanical cooling means is positioned in the internal air flow path downstream of the plurality of heat tubes. Preferably, the at least one evaporator section comprises at least one evaporator coil.

Preferably, the IDAHU comprises a mechanical cooling means (for example mechanical cooling apparatus) comprising at least one condenser section positioned in the external air flow path. It may be that positioning the at least one condenser section in the external air flow path provides a particularly efficient IDAHU, for example because external air passing along the external air flow path can be used to aid heat removal from the condenser section of the mechanical cooling means. When the IDAHU comprises one or more fans positioned in the external air flow path, it may be that the one or more fans can be operated to circulate external air over the at least one condenser section of the mechanical cooling means positioned in the external air flow path, thereby increasing the cooling capacity of the mechanical cooling means. It will be appreciated that positioning the at least one condenser section of the mechanical cooling means in the external air flow path provides a particularly space-efficient layout of IDAHU. Preferably, the at least one condenser section comprises at least one condenser coil.

Preferably, the at least one condenser section of the mechanical cooling means is detachable, for example to allow the at least one condenser section to be removed from the external air flow path for maintenance without cross-contamination of the internal and external air flow paths. Preferably, the at least one evaporator section of the mechanical cooling means is detachable, for example to allow the at least one evaporator section to be removed from the internal air flow path for maintenance without cross-contamination of the internal and external air flow paths.

Preferably, the mechanical cooling means comprises a plurality of DX coolers, for example at least three DX coolers. Preferably, each DX cooler comprises at least one evaporator coil positioned in the internal air flow path and/or at least one condenser coil positioned in the external air flow path. Preferably, the evaporator coils of the plurality of DX coolers are arranged in a row across the internal air flow path and/or the condenser coils of the plurality of DX coolers are arranged in a row across the external air flow path. Preferably, the evaporator coils of the DX cooling system are arranged in a staggered row across the internal air flow path. Preferably, the condenser coils are arranged in a staggered row across the external air flow path. It may be that when the coils are arranged in a staggered row, any one of the coils can be easily removed from the row, for example by sliding the coil along the row to the side of the air flow path.

Preferably, the external air flow path of the IDAHU is located above, for example directly above, the internal air flow path of the IDAHU. It may be that locating the external air flow path above the internal air flow path provides a particularly space-efficient arrangement of IDAHU components. Optionally, the external air flow path of the IDAHU is located above the internal air flow path of the IDAHU and each heat tube is arranged substantially vertically, for example such that for each heat tube, the first section extends directly above the second section. It may be that arranging the external air flow path above the internal air flow path and having each heat tube oriented with the first section above the second section improves the efficiency of the heat tubes, for example because the flow of the cooler, condensing working fluid back into the second section is encouraged by gravity.

Preferably, the IDAHU is arranged so that, in operation, external air flows along the external air flow path in substantially the opposite direction to the direction in which the internal air flows along the internal air flow path. Preferably, the IDAHU comprises at least two rows of heat tubes, with one row arranged upstream of the other row. It may be that when at least one heat tube is arranged upstream of at least one other heat tube, for example when the heat tubes are arranged in a plurality of rows, having the IDAHU arranged so that the internal air flows in the opposite direction to the internal air improves the efficiency of the heat tubes.

Preferably, when at least one fan is positioned in the internal air flow path, a sound attenuation means (for example sound attenuation apparatus) is positioned along the internal air flow path downstream of the at least one fan. It may be that the sound attenuation means reduces unwanted and/or excessive fan noise in the data centre. Preferably, sound attenuation apparatus is positioned adjacent to the at least one fan in the internal air flow path. Optionally, the sound attenuation apparatus and the at least one fan are mounted on a common framework. Additionally or alternatively, sound attenuation apparatus is provided adjacent to mechanical cooling apparatus in the internal air flow path.

Preferably, the internal air flow path of the IDAHU is substantially horizontal. It will be understood that when the internal air flow path is substantially horizontal, internal air flows generally horizontally along the internal air flow path during operation of the IDAHU. Preferably, the external air flow path of the IDAHU is substantially horizontal. It will be understood that when the external air flow path is substantially horizontal, external air flows generally horizontally along the external air flow path during operation of the IDAHU. It may be that when the internal and/or external air flow path of the IDAHU is substantially horizontal, the internal and/or external air flow paths present low resistance to air flow. It may be that less powerful fans are required to drive air along a horizontal air flow path.

Preferably, the internal air flow path of the IDAHU has a cross-sectional area of at least 5 $m^2$, for example at least 10 $m^2$, for at least 70% of its length, for example for at least 90% of its length. Preferably, the external air flow path of the IDAHU has a cross-sectional area of at least 5 $m^2$, for example at least 10 $m^2$, for at least 70% of its length, for example for at least 90% of its length. It will be appreciated that having an air flow path with a large cross-sectional area helps reduce air flow resistance, and allows large volumes of air to be moved through the IDAHU at relatively low velocity. For example, it may be that the IDAHU is configured to move air along the internal air flow path at an average velocity of from about 0.1 to 3 $ms^{-1}$ in some modes of operation, for example in normal operation. It will be appreciated that even at such low velocities, an IDAHU having an internal air flow path with a large cross sectional area, such as an average cross-sectional area of 10 $m^2$, is able to deliver a large volume of air, such as 1 to 30 $m^3s^{-1}$, at a low velocity, such as for example 0.1 to 3 $ms^{-1}$. It may be that an IDAHU that moves large volumes of air at low velocity operates more efficiently than an IDAHU that moves the same volume of air at higher velocity. For example, the IDAHU may require less powerful fans for operation than an IDAHU having a similar cooling capacity but with air flow paths of smaller cross-sectional area.

Preferably, the internal air flow path is substantially horizontal, and has a height of at least 1.5 m, for example at least 1.7 m, for at least 70% of its length, for example for at least 90% of its length. Preferably, the external air flow path is substantially horizontal, for example entirely horizontal, and has a height of at least 1.5 m, for example at least 1.7 m, for at least 70% of its length, for example for at least 90% of its length. It may be that having an air flow path at least 1.5 m in height allows convenient human access to equipment located in the air flow path. Preferably the internal and/or external air flow path of the IDAHU is sized and configured to allow personnel access to equipment located in the air flow path.

Preferably, the internal air flow path is substantially horizontal and has a width of at least 4 m, for example at least 6 m, for at least 70%, for example at least 90%, of its length. Preferably, the external air flow path is substantially horizontal and has a width of at least 4 m, for example at least 6 m, for at least 70%, for example at least 90%, of its length.

Preferably, the internal air flow path is substantially horizontal and has a horizontal length of at least 6 m, for example at least 10 m. Preferably, the external air flow path is substantially horizontal and has a horizontal length of at least 6 m, for example at least 10 m.

Preferably, the wetted matrix humidifier is a resilient wetted matrix humidifier. It will be appreciated that a resilient wetted matrix humidifier is a wetted matrix humidifier that does not have a single point of failure. It will be appreciated that a resilient wetted matrix humidifier improves the resilience of the IDAHU. Preferably, the resilience of the resilient wetted matrix humidifier is provided by duplication of core components of the wetted matrix humidifier required for the wetted matrix humidifier to provide adequate humidification of the external air to maintain adequate cooling capacity of the IDAHU in the event that one or more core components of the wetted matrix humidifier fails.

It will be understood that a typical wetted matrix humidifier comprises, for example, a section of air permeable wettable material mounted in a frame. Preferably, the wetted matrix humidifier comprises a pump for effecting and controlling transport of water to the section of wettable material. Optionally, the wetted matrix humidifier comprises a trough for collecting excess water draining from the section of wettable material. Preferably, the wetted matrix humidifier comprises pipework for transporting water from a trough back to a section of wettable material under the control of a pump. In operation, it may be that air picks up moisture as it passes through the section of air permeable wettable material. It may be that a core component of the wetted matrix humidifier is the pump. It will be appreciated that failure of the pump rapidly leads to failure of the humidifier as the wettable material is no longer supplied with water. It may be that the section of wettable material is a core component of the resilient wetted matrix humidifier. It will be appreciated that failure of the section of wettable material (for example if the section has to be removed for maintenance) results in failure of the wetted matrix humidifier. It may be that the top-up water supply for the humidifier is a core component. It will be appreciated that failure of the top-up water supply results in failure of the humidifier as the residual water in the humidifier is used up. One approach to improving the resilience of the IDAHU may be to provide a plurality of wetted matrix humidifiers, for example in parallel or in series. However, it will be appreciated that providing a plurality of wetted matrix humidifiers is costly and does not make efficient use of space.

Preferably, when the wetted matrix humidifier is a resilient wetted matrix humidifier, the wetted matrix humidifier comprises at least two pumps and a plurality of sections of wettable material arranged in at least two adjacent rows (for example, one row being in front of the other so that in normal operation the air to be humidified passes through both rows of wettable material). Preferably, a first row of wettable material is supplied with water from a first pump and a second row of wettable material is supplied with water from a second pump. It will be appreciated that in such an arrangement, if one of the pumps fails or if one of the rows of wettable material fails, the resilient humidifier can still be operated using the other row of wettable material and the other pump. Preferably, the resilient humidifier is provided with at least two separate top-up water supplies, for example the resilient humidifier is provided with two separate connections to a top-up water source.

A suitable resilient wetted matrix humidifier is described and claimed in PCT application entitled "Humidifier Unit" with agent's reference "P024155WO", having the same filing date and applicant (Bripco BVBA) as the present application. The contents of that application are fully incorporated herein by reference. The claims of the present application may incorporate any of the features disclosed in that patent application.

Preferably, the external air path comprises at least one bypass damper to allow the external air to bypass the wetted matrix humidifier. It will be appreciated that the wetted matrix humidifier may increase the resistance to air flow along the external air flow path. It may be that, depending on, for example, weather conditions outside of the data centre, little or no humidification of the external air is required for the IDAHU to meet the cooling requirement of the data centre. It will be appreciated that providing a bypass damper to allow the external air to bypass the wetted matrix humidifier may improve the efficiency of the IDAHU during periods that humidification of the external air is not required, for example by reducing the load on the one or more fans used to move external air along the external air flow path. Preferably, the at least one bypass damper is adjustable, for example substantially continuously adjustable, to allow varying amounts of external air to bypass the wetted matrix humidifier. An adjustable bypass damper may improve the level of control of cooling capacity and allow the cooling capacity of the IDAHU to be accurately and efficiently controlled to match the cooling requirements of the data centre. Preferably, the wetted matrix humidifier and the at least one bypass damper are arranged such that the IDAHU is operable at least in a first mode in which substantially all of the external air flowing along the external air flow path passes through the wettable material of the wetted matrix humidifier, and in a second mode in which substantially all of the ambient, external air flowing along the external air flow path bypasses the wettable material of the wetted matrix humidifier. Preferably, the wetted matrix humidifier and the at least one bypass damper are arranged such that the IDAHU is operable in a third mode in which a portion of the ambient, external air flowing along the air flow path bypasses the wettable material of the wetted matrix humidifier and a further portion of the ambient, external air flowing along the external air flow path passes through the wettable material of the wetted matrix humidifier. It will be appreciated that air bypassing the wettable material is air that does not pass through the wettable material, but may come into contact with the wettable material, for example by passing around the wettable material. Additionally or alternatively, it may be that the wetted matrix humidifier comprises at least one section of wettable material mounted such that it can be moved to allow external air to bypass the section of wettable material. For example, the at least one section of wettable material may be compressible and mounted such that it can be squashed to provide an opening free from wettable material for ambient, external air to pass through. It may be that the at least one section of compressible wettable material is mounted such that the material can be squashed to rapidly squeeze water out of the material, thereby rapidly reducing its moisture content. It will be appreciated that such arrangements of the wetted matrix humidifier may allow close control and rapid adjustment of its humidification capacity, thereby allowing the cooling capacity of the IDAHU to be closely matched to the requirements of the data centre. A suitable wetted matrix humidifier providing such close control is further disclosed and described in co-pending patent application number PCT/EP2016/062019 (Bripco BVBA). The contents of that application are fully incorporated herein by reference. The claims of the present application may incorporate any of the features disclosed in that patent application.

Preferably, the IDAHU comprises at least one controllable recirculation vent in the external air flow path. Optionally, the at least one controllable recirculation vent is configured to allow recirculation of air in the external airflow path from a portion of the external air flow path downstream of the heat tubes to a portion of the external air flow path upstream of the heat tubes. Preferably, the at least one controllable recirculation vent is operable to allow at least some of the used external air that would otherwise exit the IDAHU to be mixed with fresh external air entering the IDAHU. Optionally, the at least one controllable recirculation vent comprises at least one fan. Preferably, the IDAHU comprises a mixing chamber for mixing recirculated warm air with external air. It will be appreciated that in certain climates, and at certain times of the year, the air outside the data centre may be colder than necessary to provide adequate cooling. It may be that the air outside the data centre is so cold that contact with components of the IDAHU in the external air flow path could lead to problems of cold bridging, condensation or even ice formation in the IDAHU and/or the data centre. For example, problems of cold bridging may occur if there is inadequate insulation between the external and internal air flow paths of the IDAHU. It may be that having at least one controllable recirculation vent allows such problems to be reduced or avoided. It may be that having at least one controllable recirculation vent allows the amount of insulation between the internal and external air flow paths of the IDAHU to be reduced, thereby simplifying construction of the IDAHU. For example, it may be that the controllable recirculation vent can be operated to recirculate at least some of the external air warmed by contact with the heat tubes back to an upstream portion of the external air flow path for mixing with, or even replacement of, the colder fresh external air.

Preferably, the IDAHU comprises a plurality of heat tube panels, each heat tube panel comprising one or more heat tubes. It will be appreciated that having a plurality of panels improves the resilience of the IDAHU by allowing it to continue operating should one or more of the panels fail or require maintenance. Preferably, each heat tube panel comprises a plurality of heat tubes, for example at least 30 heat tubes. It will be appreciated that having a plurality of heat tubes in each panel also improves the resilience of the IDAHU by allowing the panel to continue to provide cooling if one or more of the heat tubes in the panel fails or requires maintenance. Preferably, the IDAHU comprises at least 6 panels of heat tubes, for example at least 12 panels of heat tubes, such as at least 18 panels of heat tubes.

Preferably, the plurality of panels of heat tubes are arranged in at least one row extending across, for example substantially entirely across, the external air flow path and extending across, for example substantially entirely across, the internal air flow path. Preferably, the panels of heat tubes are arranged in a plurality of rows, wherein each row extends across, for example substantially entirely across, the external air flow path and across, for example substantially entirely across, the internal air flow path. Preferably, the panels of heat tubes are arranged in at least three rows across the air flow paths. It may be that when the plurality of panels of heat tubes are arranged in a plurality of rows, the resilience of the IDAHU is improved, for example because if one or more panels of heat tubes is removed from one row, air allowed to bypass the remaining heat tube panels in the incomplete row still has to pass through at least one other row of heat tube panels. Furthermore, it may be that performance of the IDAHU is improved because, for example, internal air flowing along the internal air flow path is sequentially cooled by contact with multiple heat tubes in the plurality of rows, one row after another. Preferably, each row of panels comprises at least 4, for example at least 6, panels of heat tubes. Preferably, when the panels of heat tubes are arranged in a plurality of rows, at least one row is spaced apart from at least one other row by a gap of at least 0.5 m. It will be appreciated that a gap of at least 0.5 m allows human access to the spaced apart rows of panels of heat tubes.

Additionally or alternatively, when the panels of heat tubes are arranged in a plurality of rows, at least one row is arranged directly adjacent to one other row, for example with substantially no gap between the adjacent rows. Arranging rows adjacent to each other may provide efficient use of space in the IDAHU. Preferably, when at least one row is arranged directly adjacent to one other row, one side of the heat tube panels in each row remains accessible, for example by having a gap of at least 0.5 m adjacent to one side of each row of heat tube panels. Preferably, at least one, for example all, of the plurality of panels of heat tubes is removable from the IDAHU. It will be appreciated that removable panels can be repaired and/or maintained more easily.

Preferably, the heat tube panels have a height of 3 to 5 m, for example around 4 m. It may be that such a height is particularly convenient for transportation of the heat tube panels and/or the section of the IDAHU housing the heat tube panels. For example, it may be that such a height conveniently allows the panels (and, for example, an IDAHU or IDAHU module incorporating such panels) to be transported on a conventional 'low-loader' without contravening standard load-height restrictions on, for example, motorways.

Preferably, the IDAHU is a modular IDAHU, for example comprising a plurality of modules. A modular IDAHU can be constructed, assembled, and tested at a central manufacturing facility and then disassembled and shipped to site in a plurality of modules, where it can be re-assembled quickly and easily with, for example, a small, unskilled workforce. Preferably, the external air flow path is defined by a plurality of modules, for example at least three modules. Optionally, the external air flow path is defined by a set of modules comprising a filter module, a humidifier module, at least one heat tube module, a fan module and/or a mechanical cooling module. It will be appreciated that a single module may fulfil two or more functions. For example, the mechanical cooling module may incorporate filters. Preferably, the humidifier module is a wetted matrix humidifier module. Preferably, the mechanical cooling module of the external air flow path is a mechanical cooling condenser module. Preferably, the internal air flow path is defined by a plurality of modules. Optionally, the internal air flow path is defined by a set of modules comprising a filter module, a mechanical cooling module, at least one heat tube module, a fan module and/or a sound attenuation module. It will be appreciated that a single module may fulfil two or more functions. For example, the mechanical cooling module may incorporate filters. Preferably, the mechanical cooling module of the internal air flow path is a mechanical cooling evaporator module. Preferably, the at least one heat tube module defines at least part of the external air flow path and at least part of the internal air flow path. Preferably, the modular IDAHU comprises two or more heat tube modules. Preferably, the modules of the IDAHU are sized and structured so that the modules defining the external air flow path can be positioned directly above or below, for example above, the modules defining the internal air flow path. Preferably, the modules of the IDAHU defining the internal and external air flow paths are open-ended modules that provide a continuous enclosure of all sides of the air flow path that are parallel to the longitudinal axis of the air flow path. It will be understood that the modules may, for example, be provided with temporary end coverings to be fitted during, storage, transportation and installation, for example. Preferably, at least one module provides the function of two or more of the modules listed above, for example a single module preferably provides a sound attenuation and a mechanical cooling function. It will be appreciated that the modular IDAHU may comprise one or more additional modules not listed above. For example, the IDAHU may comprise a control module, for example a mechanical cooling control module. For example, the IDAHU may comprise a mechanical cooling compressor module, for example a compressor module comprising one or more mechanical cooling control panels.

Preferably, the at least one heat tube module has a height of no more than 5 m, such as no more than 4.1 m. It may be that a module having a height of no more than 5 m, such as no more than 4.1 m provides a particularly convenient balance between capacity and transportability. Preferably, the section of the internal and/or external air flow path defined by each module of the IDAHU has a cross-sectional area of at least 5 m², for example at least 10 m², for at least 50% of the length of the module (the length of the module being measured along the longitudinal axis of the air flow path). Preferably, the section of the internal and/or external air flow path defined by a module of the IDAHU has a height of at least 1.5 m, for example at least 1.7 m, for at least 50% of the length of the module. Preferably, the section of the internal and/or external air flow path defined by each module has a width of at least 4 m, for example at least 6 m, for at least 50% of the length of the module. Preferably, each module has a width of from 4.5 to 7.5 m, for example from 6 to 7 m. Preferably, each module other than the at least one heat tube module has a height of from 1.5 to 2.5 m, for example from 1.8 to 2.2 m.

Preferably, the modular IDAHU has a length of from 5 to 20 m, such as from 13 to 18 m, for example from 14 to 15 m. Preferably, the modular IDAHU has a height of from 3 to 6 m, for example no more than 5 m, such as no more than 4.1 m. Preferably, the IDAHU has a width of from 3 to 10 m, such as 4.5 to 7.5 m, for example from 6 to 7 m.

Preferably, each module of the modular IDAHU is arranged to be supported on a support structure. Additionally or alternatively, one or more of the modules of the modular IDAHU may be self-supporting. For example, it may be that the modular IDAHU is configured and arranged to require no separate support structure, for example being configured and arranged to be placed on an appropriate foundation. Preferably, each module of the modular IDAHU is configured to form a substantially air-tight seal with one or more adjacent modules. For example, it may be that one or more of the modules are open-ended modules configured to cooperate with the open end of one or more other modules. Preferably, the open-ended modules comprise a gasket sealing means (for example a gasket) around the open end to provide a substantially air-tight seal with the open end of an adjacent module.

Preferably, the IDAHU is sized and configured to meet the cooling air requirements of a data centre or section for a data centre housing at least 300 kW of IT equipment, for example housing at least 350 kW of IT equipment.

Preferably, the IDAHU is sized and configured to meet the cooling air requirements of a data centre or section for a data centre housing up to 400 kW of IT equipment, for example housing up to 375 kW of IT equipment.

According to a second aspect, the invention provides an indirect air handling unit (IDAHU) for a data centre, the indirect air handling unit comprising:

i) an external air flow path arranged to be in fluid communication with air outside the data centre; and ii) an internal air flow path arranged to be in fluid communication with air inside the data centre; wherein the external air flow path is separated from the internal air flow path.

The IDAHU may comprise a plurality of heat tubes. At least some of the heat tubes may be provided as part of a heat tube panel. There may be a plurality of such panels. Each heat tube panel may comprise one, and preferably more than one, heat tube. Each heat tube comprises a first section extending into the external air flow path and a second section extending into the internal air flow path. The heat tube panels may be arranged in at least one row across the internal air flow path and across the external air flow path.

It will be appreciated that the heat tube 'panel' may be of any shape and/or configuration. For example, the panel may have a generally planar shape and/or approximately square corners. The panel may be rectangular in cross-section, or any other shape (such as circular or square, for example), and may or may not be elongate (for example the panel could be in the shape of a cube).

Preferably, at least one of the heat tube panels configured as a removable heat tube panel. The heat tube panel may extend through an opening between the internal air flow path and the external air flow path.

It will be appreciated that a 'removable heat tube panel' is a heat tube panel that can readily be removed from the IDAHU without requiring substantial disassembly of the IDAHU and/or without causing damage to the IDAHU or the heat tube panel. It may be that an IDAHU having removable heat tube panels is more resilient than an IDAHU having non-removable heat tube panels, for example because a removable heat tube panel can be removed for maintenance, repair or replacement.

Preferably, at least one heat tube panel is movable from a first, operating position, in which the heat tube panel can be operated to exchange heat between air in the internal air flow path and air in the external air flow path, to a second position in which the heat tube panel can be removed from the IDAHU. Preferably, when the at least one heat tube panel is in the second position, it can be removed from the IDAHU without removing at least one other, for example all other, heat tube panels in the IDAHU. It will be appreciated that the first, operating position of the heat tube panel is the position that the heat tube panel occupies during normal operation of the IDAHU. Preferably, the second position of the heat tube panel is upstream or downstream of the first, operating position of the heat tube panel in the external (or internal) air flow path.

Preferably, the at least one removable heat tube panel is slidably mounted in the IDAHU. Preferably, the at least one slidably mounted removable heat tube panel is slidable between:

a) a first position in which the at least one slidably mounted removable heat tube panel is substantially coplanar with at least one other heat tube panel, and b) a second position in which the at least one slidably mounted removable heat tube panel is not substantially coplanar with the at least one other heat tube panel.

It will be appreciated that the first position of the slidably mounted removable heat tube panel may be the position that the heat tube panel occupies during normal operation of the IDAHU. It will be appreciated that when a panel is substantially coplanar with another panel, a plane defined by the first panel may be substantially parallel with a plane defined by the other panel. Preferably, when the heat tube panel is in the first position, it is coplanar with at least two other heat tube panels. It will be appreciated that when the heat tube panel is coplanar with at least two other heat tube panels, the three heat tube panels define a row of heat tube panels.

It may be that the slidable mounting comprises a plurality of bearings and/or wheels to facilitate convenient sliding of the panels so mounted. It will be appreciated that having removable heat tube panels slidably mounted in the IDAHU may allow the removable heat tube panels to be conveniently removed from the IDAHU for maintenance and/or repair.

Preferably, two or more, for example all, of the heat tube panels of the IDAHU are removable heat tube panels.

Preferably, the IDAHU comprises a plurality of removable heat tube panels arranged in a row across the external air flow path and across the internal air flow path of the IDAHU. Preferably, the plurality of removable panels of heat tubes extends through one or more openings between the internal and external air flow paths to allow the first section of each heat tube to extend into the external air flow path and the second section of each heat tube to extend into the internal air flow path. It may be that the one or more openings and the plurality of removable heat tube panels are sized and configured such that the plurality of removable heat tube panels substantially fills the one or more openings to prevent contamination between in the internal and external air flow paths when the removable heat tube panels are in their normal operating position in the IDAHU.

Preferably, the IDAHU comprises at least one adjustable opening baffle operable to maintain separation of the internal and external air flow paths when a removable heat tube panel is removed from the IDAHU. Preferably, the at least one adjustable opening baffle can be arranged to cooperate with the at least one removable panel of heat tubes and/or the one or more openings to maintain separation of the internal and external air flow paths when a removable heat tube panel is removed from the IDAHU. Preferably, the adjustable opening baffle, for example a hinged or slidable flap, is movable between a first, open position in which the adjustable opening baffle allows the removable panel of heat tubes to extend through the opening between the internal and external air flow paths and a second, closed position in which the adjustable opening baffle covers the opening between the internal and external air flow paths to prevent cross-contamination between the air flow paths when the removable panel of heat tubes is removed from the IDAHU. Optionally, the adjustable opening baffle is detachable from the IDAHU.

Additionally or alternatively, the IDAHU comprises at least one adjustable blanking baffle arranged to cooperate with each removable panel of heat tubes to prevent air flowing along the internal and/or external air flow paths bypassing the remaining one or more panels of heat tubes when the removable panel of heat tubes is removed from the IDAHU, preferably to allow substantially none of the air flowing along the internal and/or external air paths to bypass the remaining one or more panels of heat tubes when the removable panel of heat tubes is removed from the IDAHU. Preferably, the adjustable blanking baffle is movable between a first, open position in which the adjustable blanking baffle allows air to flow through the section of the removable panel of heat tubes extending into the internal and/or external air flow path and a second, closed position in which the adjustable blanking baffle extends into the internal and/or external air flow path to prevent the internal and/or external air bypassing the remaining one or more panels of heat tubes when the removable panel of heat tubes is removed from the IDAHU. Preferably, the adjustable blanking baffle is in the form of a hinged or slidable flap. Preferably, the adjustable blanking baffle is in the form of a detachable panel that is releasably mountable in the internal and/or external air flow path. It will be appreciated that such opening baffles and/or blanking baffles may allow operation of the IDAHU to be maintained when one or more of the removable panels of heat tubes is removed, for example for replacement, repair or maintenance.

Preferably, the IDAHU comprises a plurality of rows of removable heat tube panels. It will be appreciated that when the IDAHU comprises a plurality of rows of removable heat tube panels, removal of one or more of the removable heat tube panels from one of the rows may provide a gap in one row of removable heat tube panels that could allow air flowing along the internal and/or external air flow paths to bypass the heat tube panels of that row, but any air bypassing that row would nevertheless come into contact with one or more heat tube panels in the other row(s). It may be that having a plurality of rows of removable heat tubes panels thereby improves the resilience of the IDAHU, and, for example, maintains the design efficiency. It will be appreciated that when the panels are arranged in a plurality of rows, one row may be arranged in front of or behind (upstream or down stream of) another row. It may be that at least two of the rows are provided without a gap between the rows. For example, it may be that a first row of heat tube panels is provided immediately adjacent to (e.g. touching or fastened to) a second row of heat tube panels.

Preferably, the panels of heat tubes are arranged such that at least one removable panel of heat tubes can be removed from the IDAHU without removing all (for example without removing any) of the other panels of heat tubes. Preferably, the panels of heat tubes are arranged such that at least one, for example each, removable panel of heat tubes can be removed from the IDAHU without removing any of the other panels of heat tubes.

Preferably, the IDAHU comprises at least one adjustable separation baffle arranged to cooperate with the one or more removable panels of heat tubes such that each removable panel of heat tubes can be moved out of the row of heat tube panels without moving any other panels of heat tubes in the row. Preferably, the adjustable separation baffle, for example a hinged or slidable flap, is movable between a first, closed position in which the adjustable separation baffle maintains separation between the internal and external air flow paths, and a second, open position in which the adjustable separation baffle provides a further opening between the internal and external air flow streams adjacent to the opening provided by the adjustable opening baffle. Preferably, the removable panel of heat tubes can be moved into the further opening to allow its removal from the IDAHU. Preferably, when the IDAHU comprises a plurality of removable heat tube panels arranged in a row, the at least one adjustable separation baffle is arranged so that in its second, open position, one or more of the removable heat tube panels can be moved to a position out of the row, for example in front of or behind the row. It will be appreciated that having an adjustable separation baffle that allows a removable heat panel to be moved to a position out of the row allows the removable panel to be conveniently removed from the row of heat tube panels for maintenance and/or repair. Preferably, the one or more adjustable separation baffles cooperates with all of the removable heat tube panels in a row of heat tube panels to allow any one of the removable heat tube panels to be moved along adjacent to the row of heat tube panels.

It may be that one baffle functions as both an adjustable opening baffle and as an adjustable separation baffle, for example by being movable between a first fully closed position in which the baffle separates the internal and external air flow paths, a second, partially open position in which the baffle cooperates with a removable heat tube panel to separate the internal air flow paths, and a third, fully open position in which the baffle provides a further opening into which a removable heat tube panel can be moved for removal of the heat tube panel from the IDAHU. It will be appreciated that having a single baffle providing the function of both the adjustable opening baffle and the adjustable separation baffle may provide a more efficient use of space and more reliable operation, for example because the number of separate components is reduced.

Preferably, the one or more removable heat tube panels are adapted for manual transport without the need for ancillary equipment. For example, it may be that the one or more removable heat tube panels are slidably mounted on at least one rail system. It will be appreciated that slidably mounting the removable heat tube panels on at least one rail system may facilitate straightforward removal of the heat tube panel from it operating position in the IDAHU. It may be that the one or more removable heat tube panels are hung from the at least one rail system. Additionally or alternatively, the one or more removable heat tube panels may be supported on top of, for example it may rest on, the at least one rail system. Preferably, the at least one rail system is arranged to guide the removable heat tube panel from its normal operating position in a row of heat tube panels to a position in front of or behind the row of heat tube panels. Additionally or alternatively, the at least one rail system may be arranged to guide the removable heat tube panel along the row of heat tube panels, for example to the end of the row so that it can be removed from the IDAHU for maintenance or repair. Preferably, the one or more removable heat tube panels are provided with wheels or roller bearings or other such devices. It will be appreciated that providing wheels or roller bearings on the removable heat tube panel may facilitate straightforward movement of the removable heat tube panel and thus straightforward removal of the removable heat tube panel from its operating position in the IDAHU. It may be that the one or more removable heat tube panels rest on a surface provided in the IDAHU, for example on a substantially smooth surface extending at least part way across the IDAHU along which the removable heat tube panel can be manually transported, for example on its wheels or roller bearings. Preferably, the surface of the IDAHU is arranged to guide the removable heat tube panel along the row of heat tube panels, for example to the end of the row so that it can be removed from the IDAHU for maintenance or repair. For example, the surface could be provided in the form of a trough or a track.

Preferably, the IDAHU comprises at least one adjustable shutter at at least one end of each row of removable heat tube panels. The shutter may be in the form of a removable panel, or a door (such as a roller shutter door or a hinged panel door), for example. Preferably, the adjustable shutter is movable between a first, closed position that separates internal and/or external air in the IDAHU from air outside the IDAHU and a second, open position that allows a removable heat tube panel to be removed from the IDAHU. Optionally, the at least one adjustable shutter is slidably mounted on the rail system.

It will be appreciated that the IDAHU of the second aspect of the invention may be combined with any feature, for example any preferable feature, of the IDAHU of the first aspect of the invention. For example, the IDAHU of the first aspect of the invention may comprise one or more removable heat tube panels as described in relation the second aspect of the invention. Additionally or alternatively, the IDAHU of the second aspect of the invention may be a modular IDAHU, and/or may comprise one or more wetted matrix humidifiers as described for the first aspect of the invention. As a further example, the IDAHU of the second aspect of the invention may comprise the controllable recirculation vent of the first aspect of the invention.

According to a third aspect, the invention provides a data centre comprising at least one IDAHU according to the first aspect and/or the second aspect of the invention.

Preferably, the data centre comprises: i) a floor, ii) a plurality of cold aisles interleaved between a plurality of hot aisles, wherein each cold aisle is separated from an adjacent hot aisle by a rack storage area. Optionally, the data centre additionally comprises iii) at least one air supply corridor for transporting cooling air above the floor from the at least one IDAHU to one or more cold aisles. Preferably, the at least one air supply corridor provides personnel access to the one or more cold aisles and thus to a rack storage area. It may be that using a personnel access corridor to transport cooling air above the floor from the at least one IDAHU to one or more cold aisles provides a particularly efficient, low air resistance means/method of transporting large volumes of cooling air at low velocity. Preferably, the air supply corridor defines at least part of, preferably substantially all of, an internal cooling air supply path leading from the IDAHU to one or more cold aisles. Preferably, the internal cooling air supply path has a height of at least 1.5 m, for example at least 1.7 m, for at least 75%, for example at least 95%, of its length (its length being the distance from the IDAHU to the one or more cold aisles). Preferably, the internal cooling air supply path has a cross-sectional area of at least 5 $m^2$, for example at least 10 $m^2$, for at least 75%, for example at least 95%, of its length. It may be that a plurality of IDAHUs supply cooling air to one air supply corridor, for example it may be that two IDAHUs according to the first aspect of the invention supply cooling air to one air supply corridor. Preferably, the at least one air supply corridor is arranged to transport cooling air from the IDAHU to a plurality of cold aisles, for example to 6 or more cold aisles.

Preferably, the data centre of the third aspect of the invention comprises at least one air return corridor for transporting air above the floor from one or more hot aisles to the at least one IDAHU. Preferably, the at least one air return corridor provides personnel access to the one or more hot aisles and thus to a rack storage area. Preferably, the air return corridor defines at least part of, preferably substantially all of, an internal air return path from one or more hot aisles to the IDAHU. Preferably, the internal air return path has a height of at least 1.5 m, for example at least 1.7 m, for at least 75%, for example at least 95%, of its length (its length being the distance from the one or more hot aisles to the IDAHU). Preferably, the internal air return path has a cross-sectional area of at least 5 $m^2$, for example at least 10 $m^2$, for at least 75%, for example at least 95%, of its length. It may be that a plurality of IDAHUs are fed with return air from one air return corridor, for example it may be that two IDAHUs according to the first aspect of the invention are fed with return air from one air return corridor. Preferably, the at least one air return corridor is arranged to transport return air to the IDAHU from a plurality of hot aisles, for example 6 or more hot aisles.

Preferably, the data centre comprises at least one air handling unit (AHU) separate from the IDAHU for admitting fresh air into the data centre. Preferably, the AHU comprises an adjustable vent for controlling admission of fresh air (ambient air from outside the data centre building) into the data centre building. Optionally, the AHU comprises a humidification means (e.g. a humidifier) for controlling the humidity of fresh air admitted into the data centre. It may be that having a humidification means for controlling the humidity of the fresh air admitted into the data centre allows the temperature and/or humidity of the fresh air to be adjusted to match that of the air inside the data centre. Preferably, the AHU comprises at least one intake fan for drawing fresh air into the data centre building. Optionally, the AHU comprises at least one exhaust fan for expelling air from the data centre building. Preferably, the air handling capacity of the AHU is no more than 50%, for example no more than 25%, such as no more than 10%, of the air handling capacity of the IDAHU. It will appreciated that the air handling capacity of an air handling unit is the amount of air that the unit can process in a given period. For example, the air handling capacity of an air handling unit could the maximum air throughput of the air handling unit expressed in $m^3$ of air per second. Preferably, the AHU is position to introduce fresh air into the hot area of the data centre, for example into one or more hot aisles and/or one or more hot air return corridors. Optionally, the data centre comprises a plurality of AHUs. Preferably, the at least one AHU is sized and configured to replace the air inside the data centre with fresh air every 0.5 to 4 hours.

Further aspects of data centres suitable for use with the IDAHU according to the first and/or second aspect of the invention are described and disclosed in PCT patent application publication nos. WO2010/139919 and WO2010/139921. The contents of those applications are fully incorporated herein by reference. The claims of the present application may incorporate any of the features disclosed in those patent applications.

Preferably, the data centre is arranged so that internal air is transported around the data centre substantially under the control of fans integral to servers housed in the data centre.

Preferably, the data centre is a modular data centre, for example comprising at least one IDAHU module and at least one IT module.

The present invention also provides, according to a fourth aspect, a method of cooling electronic equipment in a data centre building. The method may comprise a step of providing and then operating an IDAHU according to the first and/or second aspect of the invention, and/or a data centre according to the third aspect of the invention. Preferably, the method comprises adding a controlled amount of external air from outside the data centre into the data centre building. Optionally, the method comprises providing an operating at least one air handling unit (AHU) separate from the IDAHU, as described with reference to the third aspect of the invention above. It will be appreciated that the air inside the data centre building is the internal air circulated around the data centre building to cool the items of electronic equipment housed in the data centre. Preferably, the volume of external air added to the air inside the data centre building per hour is between a quarter and double the volume of air inside the data centre building, for example the method comprises admitting approximately the same volume of external air from outside the data centre building into the data centre building as the volume of the air circulating inside the data centre building every hour. In other words, the method comprises replacing the air inside the data centre building every 0.5 to 4 hours, preferably approximately every hour. It will be appreciated that replacing the air inside the data centre building every 0.5 to 4 hours avoids the air inside the data centre building becoming stale. Preferably the method comprises filtering and/or adjusting the temperature and/or humidity of the external air admitted into the data centre building.

Preferably, the method comprises controlling the volume of air moved along the external air flow path, for example by controlling the speed of fans of the IDAHU provided in the external air flow path, in dependence on the temperature of air exiting the internal air flow path of the IDAHU. It will be appreciated that one approach to lowering the temperature of air exiting the internal air flow path (i.e. the air being used to cool the items of IT equipment) may be to increase the amount of air from outside the data centre building being contacted with the sections of heat tubes located in the external air flow path, thereby increasing the cooling capacity of the IDAHU.

Preferably, the method comprises controlling the volume of air moved along the internal air flow path, for example by controlling the speed of fans of the IDAHU provided in the internal air flow path, in dependence on the air pressure in one or more cold aisles of the data centre. It will be appreciated that when the items of IT equipment in the data centre comprise internal fans for drawing in cooling air from a cold aisle, increased demand for cooling air from the items of IT equipment may lead to a drop in pressure in the cold aisle. The resulting pressure change in the cold aisle thus indicates that larger volumes of cooling air are required from the IDAHU.

Preferably, the method comprises operating a controllable recirculation vent to allow warm air in the external air flow path of the IDAHU to recirculate from the hot side of the IDAHU to the cold side in the external air flow path. Preferably, the method comprises mixing external air from outside the data centre with recirculated warm air that has been warmed by contact with the heat tubes in the external air flow path, the external air and the warm air being mixed in the external air flow path upstream of the heat tubes. Preferably, the method comprises operating the IDAHU in at least two modes selected from:

1) a full outside air mode, in which the IDAHU is operated with substantially no recirculation of warm air from the hot side of the IDAHU to the cold side of the IDAHU in the external air flow path;

2) a partial recirculation mode, in which the IDAHU is operated with partial recirculation of warm air from the hot side of the IDAHU to the cold side of the IDAHU in the external air flow path, the recirculated warm air being mixed with external air form outside the data centre in the external air flow path upstream of the heat tubes; and 3) a full recirculation mode, in which the IDAHU is operated with recirculation of substantially all of the warm air from the hot side of the IDAHU to the cold side of the IDAHU in the external air flow path.

The present invention provides, according to a fifth aspect, a method of operating an IDAHU for a data centre, the IDAHU comprising:

i) an external air flow path, ii) an internal airflow path separated from the external air flow path, and iii) a heat exchanger.

Preferably, the heat exchanger comprises a plurality of heat tube panels, each heat tube panel comprising one or more heat tubes. Preferably, each heat tube comprises a first section extending into the external air flow path and a second section extending into the internal air flow path. Preferably, the heat tube panels are arranged in at least one row across the external air flow path and across the internal air flow path.

Preferably, the method comprises removing at least one of the plurality of heat tube panels from the IDAHU. Preferably, the method comprises removing at least one of the plurality of heat tube panels without removing all of the other heat tube panels. Preferably, the method comprises:

a) operating the IDAHU in a first mode in which all of the plurality of heat tube panels are used to cool air flowing along the internal air flow path;

b) removing at least one of the plurality of heat tube panels from the IDAHU; and c) operating the IDAHU in a second mode in which all of the remaining heat tube panels are used to cool air flowing along the internal air flow path.

Preferably, the method additionally comprises d) inserting a replacement heat tube panel into the IDAHU, and e) operating the IDAHU in a third mode in which all of the remaining heat tube panels and the replacement heat tube panel are used to cool air flowing along the internal air flow path. Optionally, the replacement heat tube panel is the removed heat tube panel wherein the removed heat tube panel has been subjected to inspection, maintenance or repair.

Preferably, the method comprises operating the IDAHU in an intermediate mode in which the remaining heat tube panels are used to cool air flowing along the internal air flow path during the step of removing at least one of the plurality of heat tube panels. In other words, the method comprises removing at least one of the plurality of heat tube panels while continuing to operate the IDAHU to cool air flowing along the internal air flow path.

Optionally, the step of removing the at least one heat tube panel comprises moving a first heat tube panel from a first position coplanar with a second heat tube panel to a second position not coplanar with the second heat tube panel, and removing the first heat tube panel from the IDAHU.

Preferably, IDAHU remains operational when the first heat tube panel is removed from the IDAHU. In other words, the method comprises supplying cooling air to the data centre from the IDAHU after the first heat tube panel is removed from the data centre. Preferably, the IDAHU continues to be operational while the method of the fifth aspect of the invention is carried out. In other words, the method comprises supplying cooling air to the data centre from the IDAHU during the step of moving the first heat tube panel from the first position to the second position.

Preferably, the method of the fifth aspect of the invention comprises operating an IDAHU according to the first or second aspect of the invention. Preferably, the IDAHU comprises at least one adjustable opening baffle operable to cooperate with the removable heat tube panel to provide an opening between the internal and external air flow paths for the removable heat tube panel to occupy when the removable heat tube panel is positioned in the row of heat tube panels and to separate the internal and external air flow paths when the removable heat tube panel is not positioned in the row of heat tube panels. Preferably, the IDAHU comprises at least one adjustable separation baffle operable to cooperate with the removable heat tube panel to provide an opening between the internal and external air flow paths for the removable heat tube panel to occupy when the removable heat tube panel is positioned in front of or behind the row of heat tube panels and to separate the internal and external air flow paths when the heat tube panel is positioned in the row of heat tube panels. Preferably, the IDAHU comprises at least one adjustable blanking baffle operable to cooperate with the removable heat tube panel to allow air flowing along the internal and/or external air flow paths to pass through the removable heat tube panel when it is positioned in the row of heat tube panels and to prevent air flowing along the internal and/or external air flow path bypassing the other heat tube panels in the row of heat tube panels when the removable heat tube panel is not positioned in the row of heat tube panels. Preferably, the method comprises operating the adjustable opening baffle and/or the adjustable separating baffle in cooperation with the removable heat tube panel to maintain separation between the internal and external air flow paths when the removable heat tube panel is moved from the first position to the second position. Preferably, the method comprises operating the adjustable blanking baffle to maintain airflow through the heat tube panels in the row of heat tube panels when the removable heat tube panel is moved from the first position to the second position.

Preferably, the method according to the fifth aspect of the invention comprises:

moving a first adjustable separating baffle from a first closed position to a second open position to provide a first opening between the internal and external air flow paths, moving the first removable heat tube panel into the first opening thereby uncovering a second opening between the internal and external air flow paths, moving at least one adjustable opening baffle from a first, open position to a second, closed position to cover the second opening, moving the first removable heat tube panel from the first opening either:

to a third opening between the internal and external air flow paths provided by opening a second adjustable separating baffle, to another part of the IDAHU, or out of the IDAHU, and moving the first adjustable separating baffle from the second, open position to the first, closed position to close the first opening between the internal and external air flow paths.

Preferably, the method according to the fifth aspect of the invention also comprises moving at least one adjustable blanking baffle from a first, open position to a second closed position to direct air flowing along the internal air flow path through the second heat tube panel and optionally further heat tube panels.

Preferably, the method of the fifth aspect of the invention comprises:
   inserting a third heat tube panel into the IDAHU, and
   moving the third heat tube panel from a third position in front of or behind the second heat tube panel to a fourth position coplanar with, for example adjacent to, the second heat tube panel.

Preferably, the method of the fifth aspect of the invention comprises:
   moving the first adjustable separating baffle from the first closed position to the second open position to re-open the first opening between the internal and external air flow paths,
   moving the third removable heat tube panel into the first opening,
   moving the at least one opening baffle from the second, closed position to the first, open position to re-open the second opening between the internal and external air flow paths,
   moving the third removable heat tube panel into the second opening, and
   moving the first adjustable separating baffle from the second, open position to the first, closed position to close the first opening between the internal and external air flow paths.

Preferably, the method according to the fifth aspect of the invention also comprises moving at least one adjustable blanking baffle from a second, closed position to a first, open position to allow air flowing along the internal air flow path through the third heat tube panel.

Preferably, the heat tube panels of the IDAHU are slidably mounted in the IDAHU, for example on one or more bearings, wheels or rails.

Preferably, the function of the first adjustable separating baffle and the function of the at least one opening baffle is provided by the same baffle.

Preferably, the method according to the fifth aspect of the invention comprises operating the IDAHU in a first mode in which ambient air enters the IDAHU, flows along the external air flow path and exits the IDAHU to the atmosphere, and in a second mode in which at least some of the air flowing along the external air flow path is recirculated from a portion of the external air flow path downstream of the heat tubes to a portion of the external air flow path upstream of the heat tubes, wherein at least some of the external air is recirculated without exiting the IDAHU.

It will of course be appreciated that features described in relation to one aspect of the present invention may be incorporated into other aspects of the present invention. For example, the method of the invention may incorporate any of the features described with reference to the apparatus of the invention and vice versa.

DESCRIPTION OF THE DRAWINGS

Embodiments of the present invention will now be described by way of example only with reference to the accompanying schematic drawings of which:
FIG. 22a shows a sequence of cut-away perspective views of the heat tube module of FIG. 21a.

DETAILED DESCRIPTION

Figure 1:
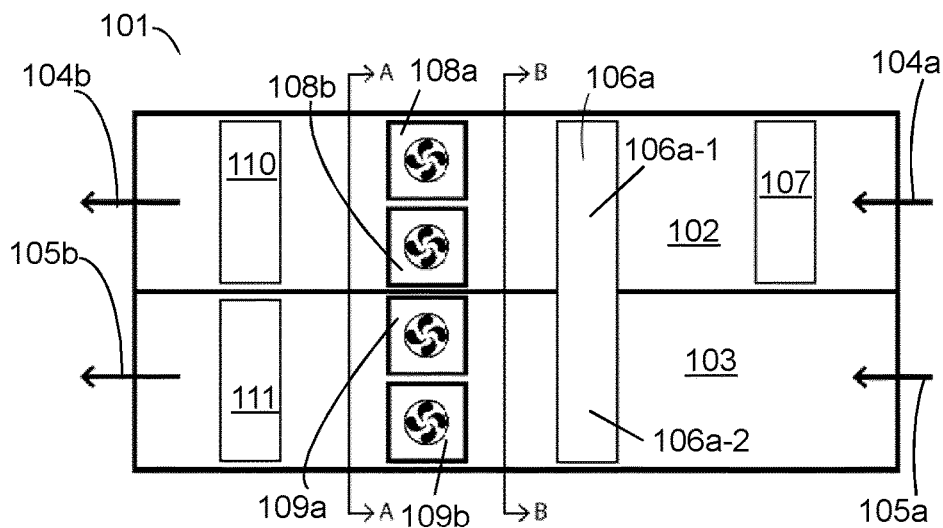
FIG. 1 shows schematically a sectional side elevation of a first embodiment of an IDAHU.

FIG. 1 shows schematically a sectional side elevation of a first embodiment of an Indirect Air Handling Unit (IDAHU) 101. The IDAHU 101 comprises an external air flow path 102 and a separate internal air flow path 103. The external air flow path 102 is arranged to be in fluid communication with air outside the data centre such that, in use, external air enters the external air flow path 102 as shown by arrow 104a and is returned to outside the data centre as shown by arrow 104b. The internal air flow path 103 is arranged to be in fluid communication with air inside the data centre such that, in use, internal air enters the internal air flow path 103 as shown by arrow 105a and is returned to the inside of the data centre as shown by arrow 105b. The IDAHU 101 comprises a plurality of heat tubes arranged in a plurality of heat tube panels 106 (only one heat tube panel, 106a is shown in FIG. 1, heat tube panels 106b to 106f are shown in FIG. 3), each heat tube panel having a first section extending into the external air flow path 102 and a second section extending into the internal air flow path 103 (the first section 106a-1 and second section 106a-2 of heat tube panel 106a are shown in FIG. 1). The IDAHU also comprises a wetted matrix humidifier 107 positioned in the external air flow path 102 upstream of the heat tube panels 106, a plurality of external air fans 108 (fans 108a and 108b are shown in FIG. 1, further fans are shown in FIG. 2) positioned in the external air flow path 102 downstream of the heat tube panels 106, a plurality of internal air fans 109 (fans 109a and 109b are shown in FIG. 1, further fans are shown in FIG. 2) positioned in the internal air flow path 103 downstream of the heat tube panels 106, DX condenser coil 110 positioned in the external air flow path 102 downstream of the external air fans 108 and DX evaporator coil 111 positioned in the internal air flow path 103 downstream of the internal air fans 109.

In the IDAHU 101, the external air flow path 102 is positioned directly above the internal air flow path 103. In operation, the external air flows horizontally along the external air flow path 102 parallel to and in the same direction as the flow of internal air along the internal air flow path 103.

Figure 2:
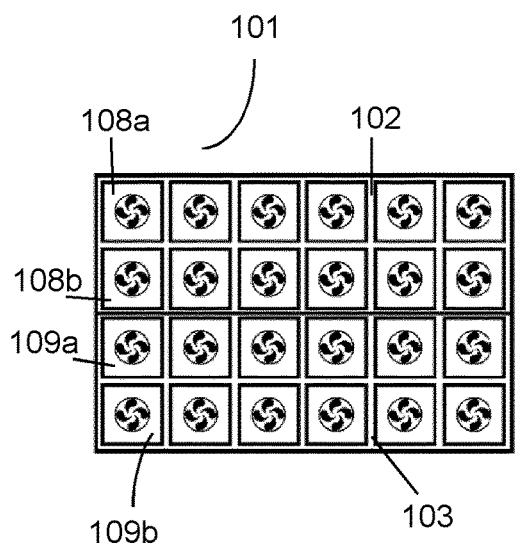
FIG. 2 shows a cross-sectional view of the IDAHU of FIG. 1.
Figure 3:
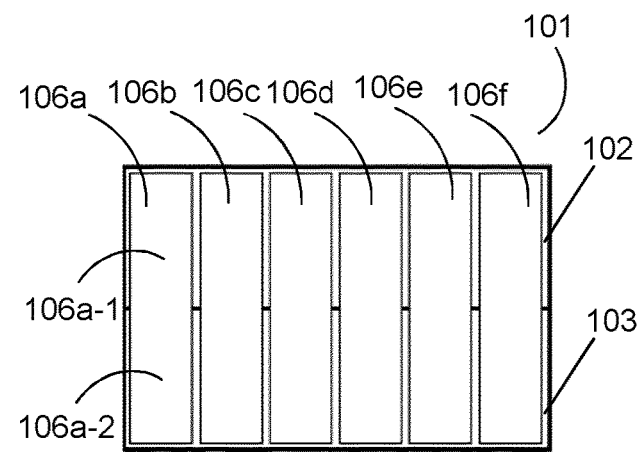
FIG. 3 shows a cross-sectional view of the IDAHU of FIG. 1.

FIG. 2 shows a cross-sectional view of the IDAHU 101 of FIG. 1 at the position indicated by the arrows marked "A" in FIG. 1, the position being immediately downstream of the external fans 108 and the internal fans 109 and looking upstream (i.e. towards the fans 108, 109). IDAHU 101 comprises: twelve external air fans 108 arranged in two rows of six fans across the external air flow path 103, one row being positioned above the other; and twelve internal air fans 109 arranged in two rows of six fans across the internal air flow path 103, one row being directly above the other row, the external air fans 108 being directly above the internal air fans 109.

FIG. 3 shows a cross-sectional view of the IDAHU 101 of FIG. 1 at the position indicated by the arrows marked "B" in FIG. 1, the position being immediately downstream of the heat tube panels 106 and looking upstream (i.e. towards the panels 106). IDAHU comprises six heat tube panels arranged in a row across the external air flow path 102 and across the internal air flow path 103, each panel 106 having a first, upper section extending into the external air flow path 102 and a second, lower section extending into the internal air flow path 103.

Figure 4:
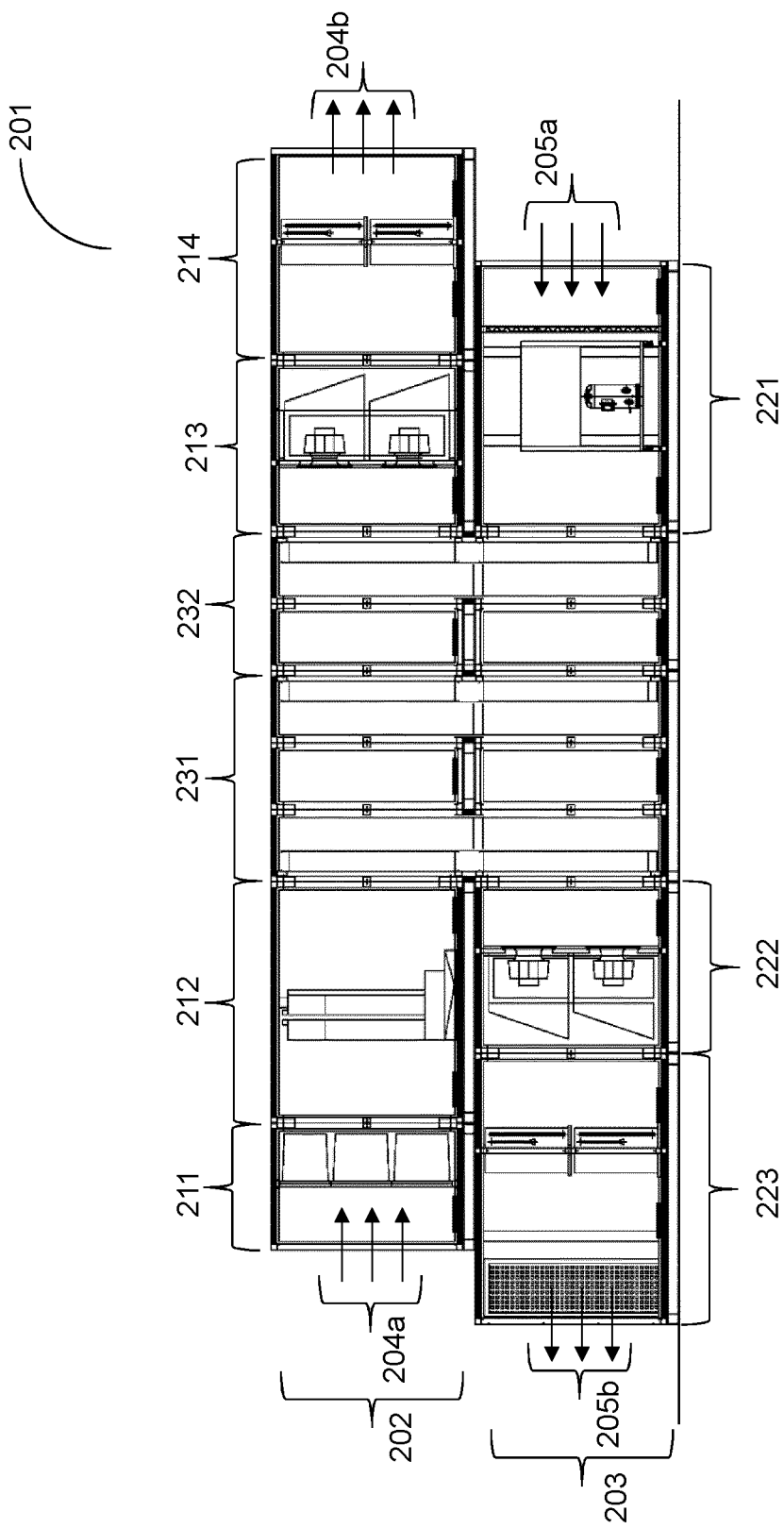
FIG. 4 shows a sectional side elevation of a second embodiment of an IDAHU, the IDAHU being a modular IDAHU.

FIG. 4 shows a sectional side elevation of a second embodiment of an IDAHU 201. IDAHU 201 comprises an upper deck 202 that defines an external air flow path positioned above a lower deck 203 that defines an internal air flow path, the external and internal air flow paths being horizontal. In use, external air enters the external air flow path as shown by arrows 204a, and exits the external air flow path as shown by arrows 204b. Internal air enters the internal air flow path as shown by arrows 205a and flows along the internal air flow path parallel to the flow of external air flowing along the external air flow path, but in the opposite direction, and then exits the internal air flow path as indicated by arrows 205b. IDAHU 201 is a modular IDAHU, comprising a plurality of external air flow path modules, a plurality of internal air flow path modules and a plurality of heat tube modules (each of which define a section of the internal air flow path and a section of the external air flow path.

Modular IDAHU 201 comprises first heat tube module 231 and second heat tube module 232 which each define a section of the internal air flow path and a section of the external air flow path, the first heat tube module 231 being arranged upstream of the second heat tube module 232 in the external air flow path, and downstream of module 231 in the internal air flow path.

Modular IDAHU 201 further comprises: a humidification module 212 positioned immediately upstream of the first heat tube module 231 in the external air flow path; a filter module 211 (having an air intake through which external air enters the external air flow path as indicated by arrows 204a) positioned immediately upstream of the humidification module 212 in the external air flow path; external fan module 213 positioned immediately downstream of the second heat tube module 232 in the external air flow path; and DX condenser coil module 214 (having an air exhaust through which external air exits the external air flow path as indicated by arrows 204b) positioned immediately downstream of the external fan module 213. In operation, external air enters the IDAHU 201 through the air intake in the filter module 211, then passes through the filter module 211 (where it is filtered to remove particulates such as dust or pollen), the humidification module 212 (where it is humidified if necessary to increase the cooling capacity of the external air), the two heat tube modules 231 and 232 (where it removes heat from the heat tubes thereby indirectly cooling the internal air), the external fan module 213 (which controls and effects movement of the external air along the external air flow path), and then finally the DX condenser coil module 214 (where it removes heat from the DX condenser coils when the DX cooling system is operational) before it exits the IDAHU 201 through the exhaust in the DX condenser module 214.

Modular IDAHU 201 also comprises: a DX compressor module 221 (having an air intake through which internal air enters the internal air flow path as indicated by arrows 205b, the DX compressor module 221 housing the DX cooling control system and the pumps and compressors that operate the DX cooling system) positioned immediately upstream of the second heat tube module 232 in the internal air flow path; internal fan module 222 positioned immediately downstream of the first heat tube module 231 in the internal air flow path; and a DX evaporator coil and sound attenuation module 223 (having an air exhaust through which internal air exits the internal air flow path as indicated by arrows 205b) positioned immediately downstream of the internal fan module 222. In operation, internal air from the data centre enters the IDAHU 201 through the air intake in the DX compressor module 221, then passes through the DX compressor module 221 (where it is filtered), the heat tube modules 232 and 231 (where it is cooled by contact with the heat tubes), the internal fan module 222 (which controls and effects movement of the internal air along the internal air flow path), and then finally the DX evaporator coil and sound attenuation module 223 (where it is cooled by contact with the DX evaporator coils when the DX cooling system is in operation) before it exits the IDAHU 201 though the exhaust in the DX evaporator coil and sound attenuation module 223.

The various modules of the IDAHU 201 described above are shown individually in FIGS. 5 to 13.

Figure 4A:
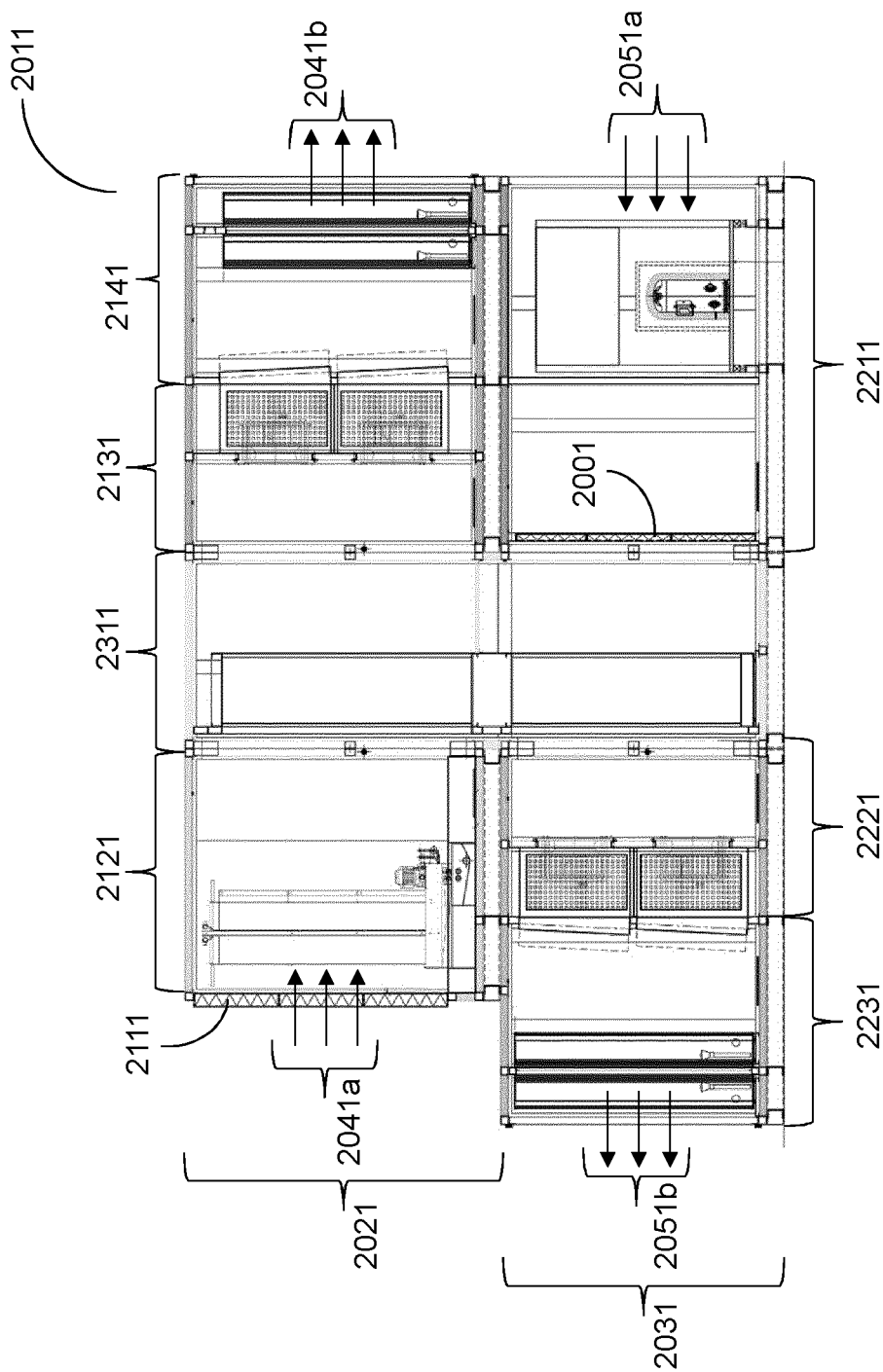
FIG. 4a shows a sectional side elevation of a third embodiment of an IDAHU, the IDAHU being a modular IDAHU.

FIG. 4a shows a sectional side elevation of a third embodiment of an IDAHU 2011. IDAHU 2011 is a module IDAHU with a similar but more compact arrangement of modules as provided in the IDAHU 201 of FIG. 4. The IDAHU 2011 comprises upper and lower decks 2021, 2031 defining horizontal external and internal air flow paths. Arrows 2041a, 2041b show external air entering and exiting the external air flow path, and arrows 2051a, 2051b show internal air entering and exiting the internal air flow path.

Modular IDAHU 2011 comprises: a heat tube module 2311 defining sections of the internal and external air flow paths; a humidification module 2121 positioned immediately upstream of the heat tube module 2311 in the external air flow path, the humidification module 2121 comprising filters 2111 at its upstream end; external fan module 2131 positioned immediately downstream of the heat tube module 2311 in the external air flow path; DX condenser coil module 2141 positioned immediately downstream of the external fan module 2131; a DX compressor module 2211 positioned immediately upstream of the heat tube module 2311 in the internal air flow path, the DX compressor module 2211 comprising filters 2001 at its downstream end; internal fan module 2221 positioned immediately downstream of the heat tube module 2311 in the internal air flow path; and a DX evaporator coil and sound attenuation module 2231 positioned immediately downstream of the internal fan module 2221.

Figure 5:
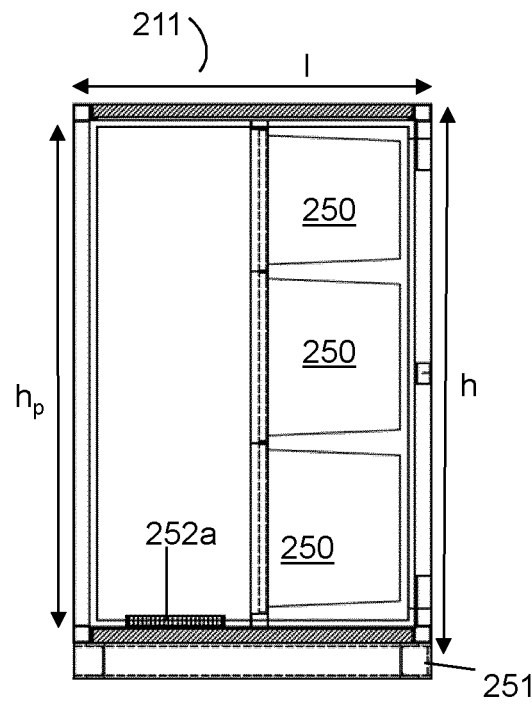
FIG. 5 shows a sectional side elevation of the filter module of the IDAHU of FIG. 4.

FIG. 5 shows a sectional side elevation of the filter module 211 of the IDAHU 201 of FIG. 4. The filter module 211 comprises an air inlet (not shown) for admitting external air into the IDAHU 201, and three rows of ten bag filters 250 arranged with an upper row and a middle row directly above a lower row across the external air flow path of the IDAHU 201. The filter module 211 is arranged to be supported on a structural support 251 and is provided with a walkway 252a to allow personnel access to the upstream side of the filters 250. The filter module 211 has a height h of 1.9 m and a length l of 1.3 m, and defines a section of the external air flow path having a height $h_p$ of 1.8 m.

Figure 6:
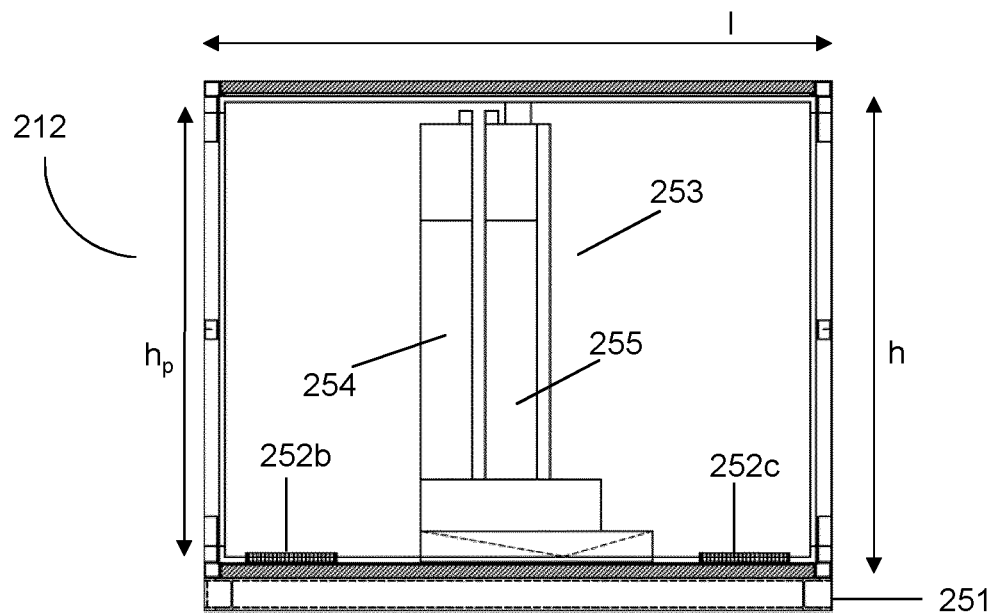
FIG. 6 shows a sectional side elevation of the humidification module of the IDAHU of FIG. 4.

FIG. 6 shows a sectional side elevation of the humidification module 212 of the IDAHU 201 of FIG. 4. The humidification module 212 comprises a wetted matrix humidifier 253 comprising two parallel banks 254, 255 of wetted matrix panels, both of which banks 254, 255 extend substantially across the entire width and height of the internal air flow path defined by the humidification module 212. Wetted matrix panel bank 254 is positioned immediately upstream of wetted matrix panel bank 255. The humidification module 212 is arranged to be supported on a structural support 251 and is provided with walkways 252b and 252c to allow personnel access to the upstream and downstream sides, respectively, of the humidifier 253 (walkway 252b also providing personnel access to the downstream side of bag filters 250 when the IDAHU 201 is assembled). The humidification module 212 has a height h of 1.9 m and a length l of 2.4 m, and defines a section of the external air flow path having a height $h_p$ of 1.8 m.

Figure 7:
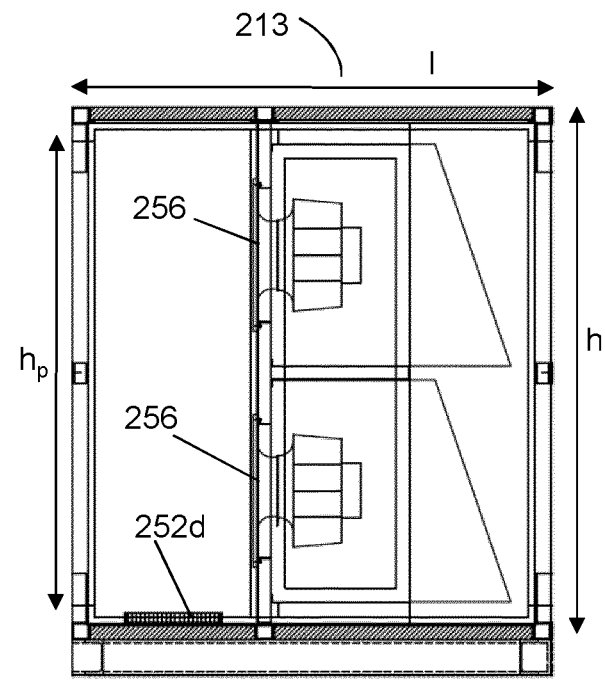
FIG. 7 shows a sectional side elevation of the external fan module of the IDAHU of FIG. 4.

FIG. 7 shows a sectional side elevation of the external fan module 213 of the IDAHU 201 of FIG. 4. The external fan module 213 comprises sixteen fans 256 arranged in two rows of eight across the external air flow path, one row positioned directly above the other. The external fan module 213 is arranged to be supported on structural support 251 and is provided with a walkway 252d to allow personnel access to the upstream side of the fans 256. The external fan module 213 has a height h of 1.9 m and a length l of 1.7 m, and defines a section of the external air flow path having a height $h_p$ of 1.8 m.

Figure 8:
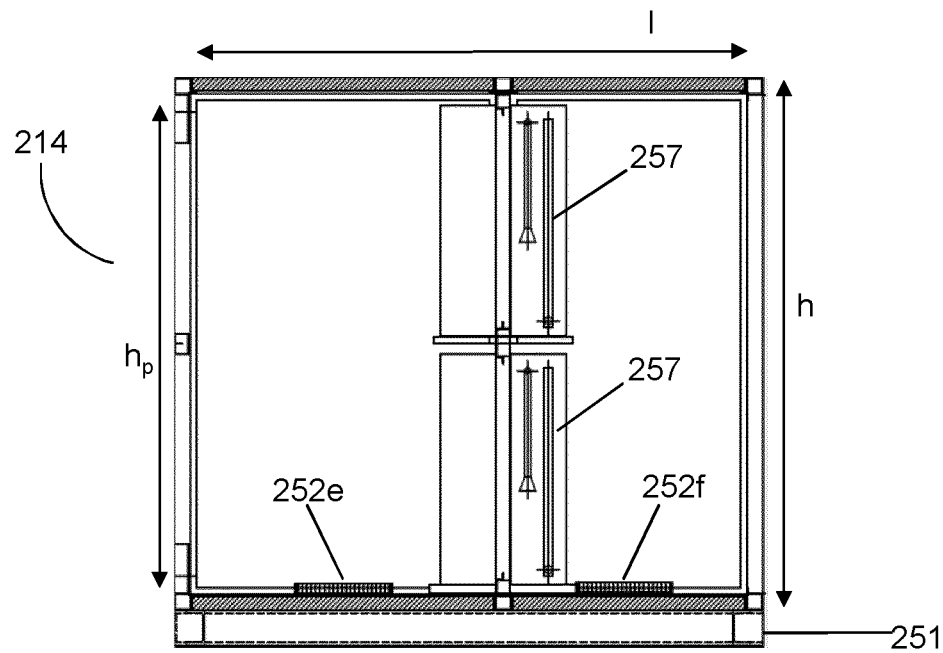
FIG. 8 shows a sectional side elevation of the DX condenser coil module of the IDAHU of FIG. 4.

FIG. 8 shows a sectional side elevation of the DX condenser coil module 214 of the IDAHU 201 of FIG. 4. The DX condenser coil module 214 comprises an air exhaust (not shown) for allowing air to exit the IDAHU 201 to outside of the data centre, and two rows of three condenser coil panels 257 across the external air flow path, one row positioned directly above the other. The DX condenser coil module 214 is arranged to be supported on structural support 251 and is provided with walkways 252e and 252f to allow personnel access to the upstream and downstream sides, respectively, of the condenser coils 257 (walkway 252e also allowing personnel access to the downstream side of the fans 256 of the external fan module 213 when the IDAHU 201 is assembled). The DX condenser coil module 214 has a height h of 1.9 m and a length l of 2.1 m, and defines a section of the external air flow path having a height $h_p$ of 1.8 m.

Figure 9:
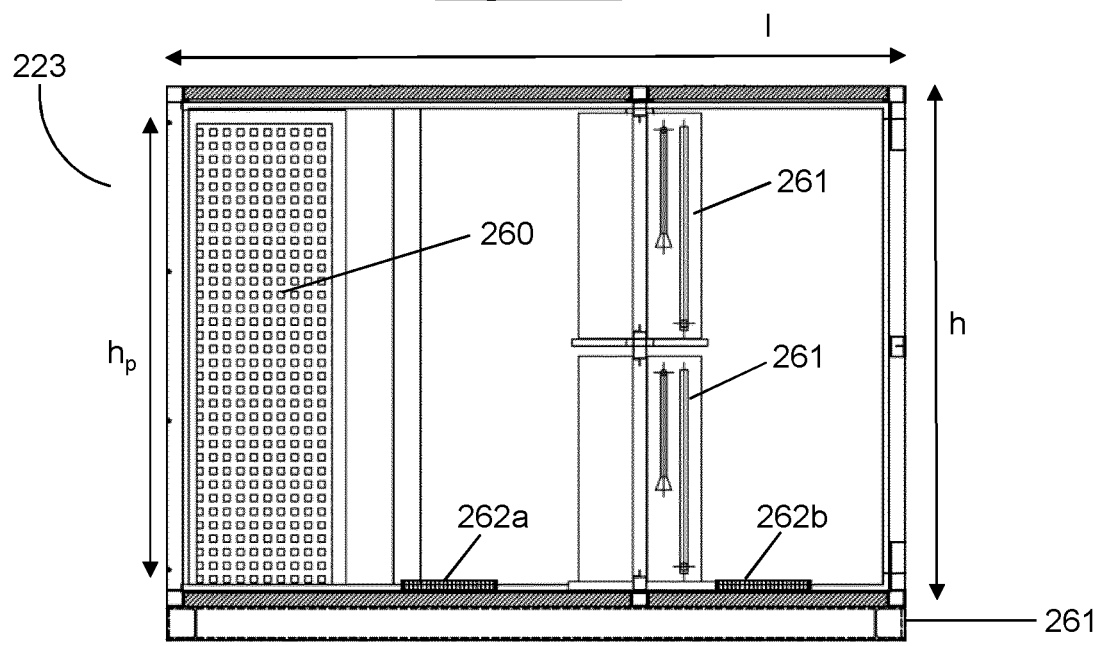
FIG. 9 shows a sectional side elevation of the DX evaporator coil and sound attenuation module of the IDAHU of FIG. 4.

FIG. 9 shows a sectional side elevation of the DX evaporator coil and sound attenuation module 223 of the IDAHU 201 of FIG. 4. The DX evaporator coil and sound attenuation module 223 comprises an air exhaust (not shown) to allow air to exit the IDAHU to inside of the data centre, a sound attenuation device 260 (which reduces the level of noise of the IDAHU, for example from the fans, in the data centre), and two rows of three DX evaporator coil panels 261 across the internal air flow path, one row being positioned directly above the other. The DX evaporator coil and sound attenuation module 223 is arranged to be supported on structural support 261 and is provided with walkways 262a and 262b to allow personnel access to the downstream and upstream sides, respectively, of the DX evaporator coils 261, walkway 262a also providing personnel access to the upstream side of the sound attenuation device 260. The DX evaporator coil and sound attenuation module 223 has a height h of 1.9 m and a length l of 2.7 m, and defines a section of the internal air flow path having a height $h_p$ of 1.8 m.

Figure 10:
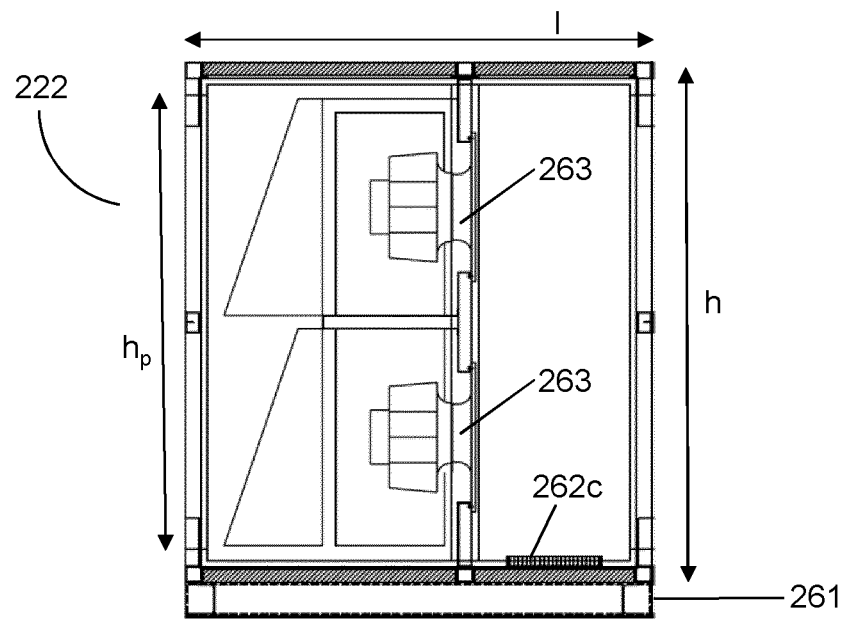
FIG. 10 shows a sectional side elevation of the internal fan module of the IDAHU of FIG. 4.

FIG. 10 shows a sectional side elevation of the internal fan module 222 of the IDAHU 201 of FIG. 4. The internal fan module 22 comprises sixteen fans 263 arranged in two rows of eight across the internal air flow path, one row positioned directly above the other. The internal fan module 222 is arranged to be supported on structural support 261 and is provided with a walkway 262c to allow personnel access to the upstream side of the fans 263. The internal fan module 222 has a height h of 1.9 m and a length l of 1.7 m, and defines a section of the internal air flow path having a height $h_p$ of 1.8 m.

Figure 11:
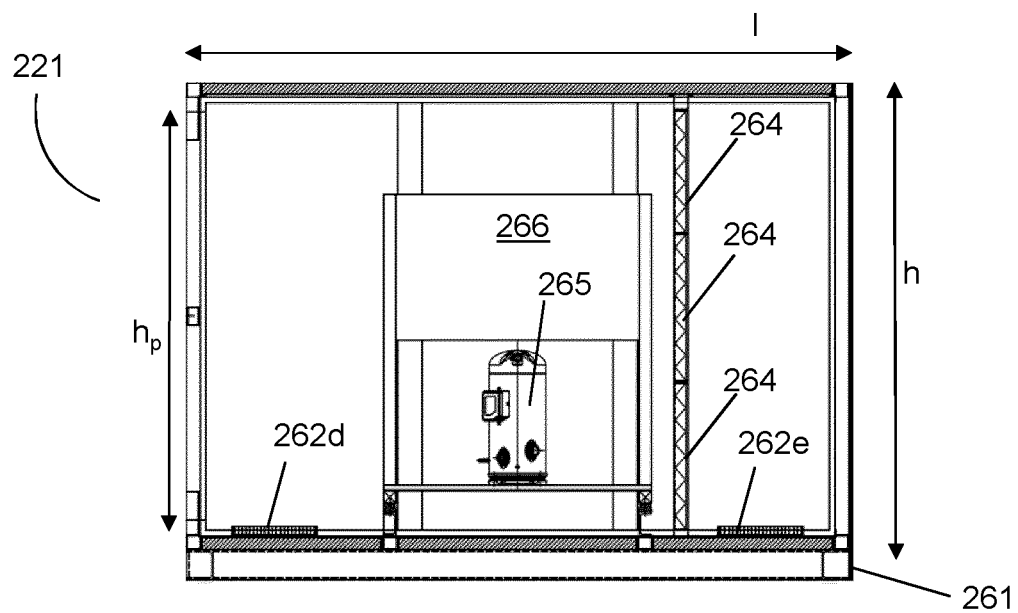
FIG. 11 shows a sectional side elevation of the DX compressor module of the IDAHU of FIG. 4.

FIG. 11 shows a sectional side elevation of the DX compressor module 221 of the IDAHU 201 of FIG. 4. The DX compressor module 221 comprises an air inlet (not shown) for admitting internal air from inside the data centre building into the IDAHU 201, three rows of ten panel filters 264 arranged with an upper row and a middle row directly above a lower row across the internal air flow path of the IDAHU 201, a plurality of DX compressors 265 and a plurality of DX control panels 266. The DX compressor module 221 is arranged to be supported on structural support 261 and is provided with walkways 262d to allow personnel access to the downstream side of the DX control panels 266 and the DX compressors 265, and with walkway 262e to allow personnel access to the upstream side of the filter panels 264. The DX compressor module 221 is also provided with a plurality of walkways (not shown) extending along the internal air flow path to allow personnel access to the sides of the DX control panels 266 and the DX compressors 265 and to the downstream side of the filter panels 264. The DX compressor module 221 has a height h of 1.9 m and a length l of 2.7 m, and defines a section of the internal air flow path having a height $h_p$ of 1.8 m.

Figure 12:
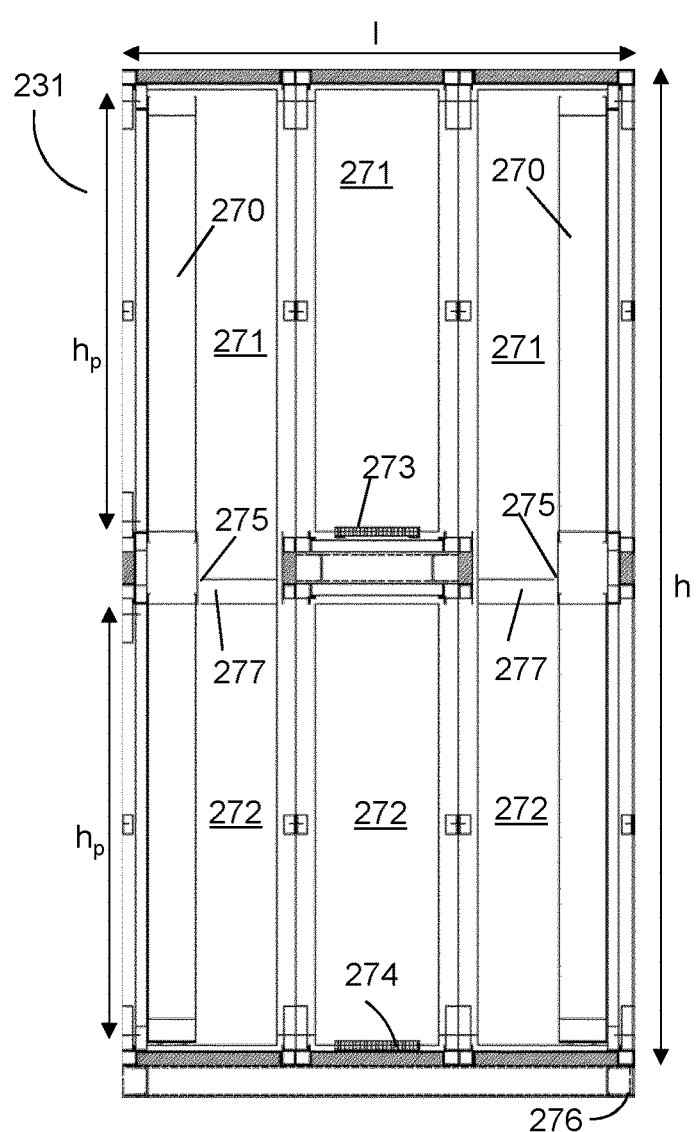
FIG. 12 shows a sectional side elevation of the first heat tube module of the IDAHU of FIG. 4.

FIG. 12 shows a sectional side elevation of the first heat tube module 231 of the IDAHU 201 of FIG. 4. The first heat tube module 231 spans the upper and lower decks 202, 203 of the IDAHU 201. The first heat tube module 231 comprises two rows of six heat tube panels 270, each row being arranged across the internal air flow path and across the external air flow path of the IDAHU 201. Each heat tube panel comprises 36 parallel vertically oriented heat tubes (not shown). One of the rows of heat tube panels 270 is positioned at one end of the first heat tube module 231, and the other row of heat tube panels 270 is positioned at the other end of the first heat tube module 231. The heat tube module 231 defines a section of the external air flow path 271 and a section of the internal air flow path 272, each section 271, 272 having a height $h_p$ of 1.8 m. The first heat tube module 231 is provided with an upper walkway 273 in the section of external air flow path 271 and with a lower walkway 274 in the section of internal air flow path 272, the upper and lower walkways 273, 274 being positioned between the two rows of heat tube panels 270. The heat tube panels 270 extend through an opening 275 between the section of external air flow path 271 and the section of internal air flow path 272. The upper walkway 273 allows personnel access to the section of external air flow path 271 and thus to the sections of the heat tube panels 270 that extend into the external air flow path. The lower walkway 274 allows personnel access to the section of internal air flow path 272 and thus to the sections of the heat tube panels 270 that extend into the internal air flow path. The walkway 252c at the downstream end of the humidifier module 212, and the walkway 262c of the internal fan module 222 also allow personnel access to the heat tube panels 270 of the first heat tube module 231 located at the end of the first heat tube module 231 that joins the humidifier module 212 and the internal fan module 222 when the IDAHU 201 is assembled. The first heat tube module 231 is arranged to be supported on a support structure 276, and has a height h of 4.0 m and a length l of 2.1 m. The first heat tube module 231 also comprises adjustable separating baffles 277 which can be operated to increase the size of the opening 275 and thus allow the heat tube panels 270 to be moved out of their respective row of heat tube panels 270 towards the upper and lower walkways 273, 274, thus allowing each heat tube panel 270 to be moved along adjacent to the row of heat tube panels 270 and to the side of the first heat tube panel module 231 for removal.

Figure 13:
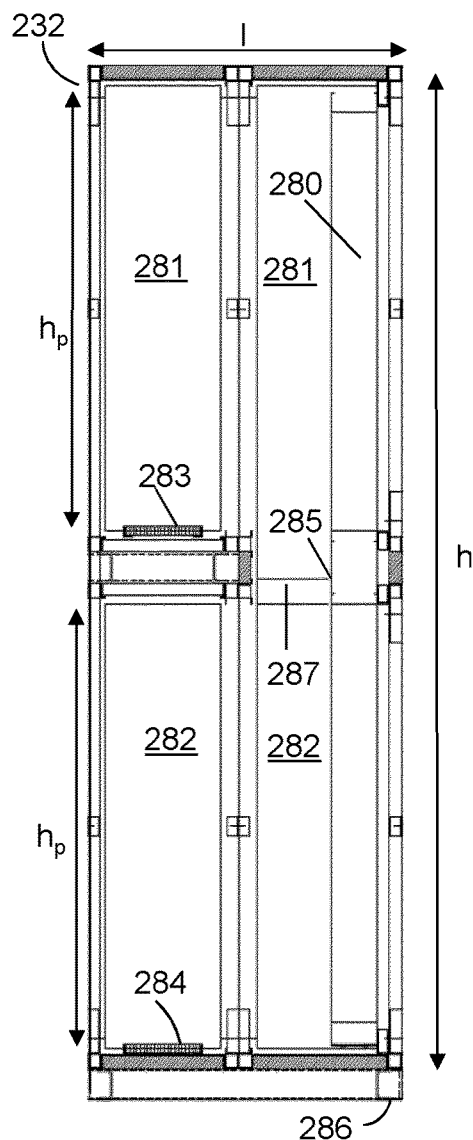
FIG. 13 shows a sectional side elevation of the second heat tube module of the IDAHU of FIG. 4.

FIG. 13 shows a sectional side elevation of the second heat tube module 232 of the IDAHU 201 of FIG. 4. The second heat tube module 232 spans the upper and lower decks 202, 203 of the IDAHU 201. The second heat tube module 232 comprises one row of six heat tube panels 280, each row being arranged across the internal air flow path and across the external air flow path of the IDAHU 201. Each heat tube panel comprises 36 parallel, vertically oriented heat tubes (not shown). The row of heat tube panels 280 is positioned at one end of the second heat tube module 232 (the end opposite the end that joins the second heat tube module 232 to the first heat tube module 231 when the IDAHU 201 is assembled). The second heat tube module 232 defines a section of the external air flow path 281 and a section of the internal air flow path 282, each section 281, 282 having a height $h_p$ of 1.8 m. The second heat tube module 232 is provided with an upper walkway 283 in the section of external air flow path 281 and with a lower walkway 284 in the section of internal air flow path 282, the upper and lower walkways 283, 284 being positioned adjacent to the row of heat tube panels 280 at the end of the second heat tube module 232 that joins the first heat tube module 231. The heat tube panels 280 extend through an opening 285 between the section of external air flow path 281 and the section of internal air flow path 282. The upper walkway 283 allows personnel access to the section of external air flow path 281 and thus to the sections of the heat tube panels 280 that extend into the external air flow path (and also to the corresponding sections of the heat tube panels 270 of the first heat tube module 231 when the IDAHU 201 is assembled). The lower walkway 284 allows personnel access to the section of internal air flow path 282 and thus to the sections of the heat tube panels 280 that extend into the internal air flow path (and also to the corresponding sections of the heat tube panels 270 of the first heat tube module 231 when the IDAHU 201 is assembled). The walkway 262d at the downstream end of the DX compressor module 221, and the walkway 252d of the external fan module 213 also allow personnel access to the heat tube panels 280 of the second heat tube module 232 when the IDAHU 201 is assembled. The second heat tube module 232 is arranged to be supported on a support structure 286, and has a height h of 4.0 m and a length l of 2.1 m. The second heat tube module 232 also comprises adjustable separating baffles 287 which can be operated to increase the size of the opening 285 and thus allow the heat tube panels 280 to be moved out of the row of heat tube panels 280 towards the upper and lower walkways 283, 284, thus allowing each heat tube panel 280 to be moved along adjacent to the row of heat tube panels 280 and to the side of the second heat tube panel module 232 for removal.

Figure 14:
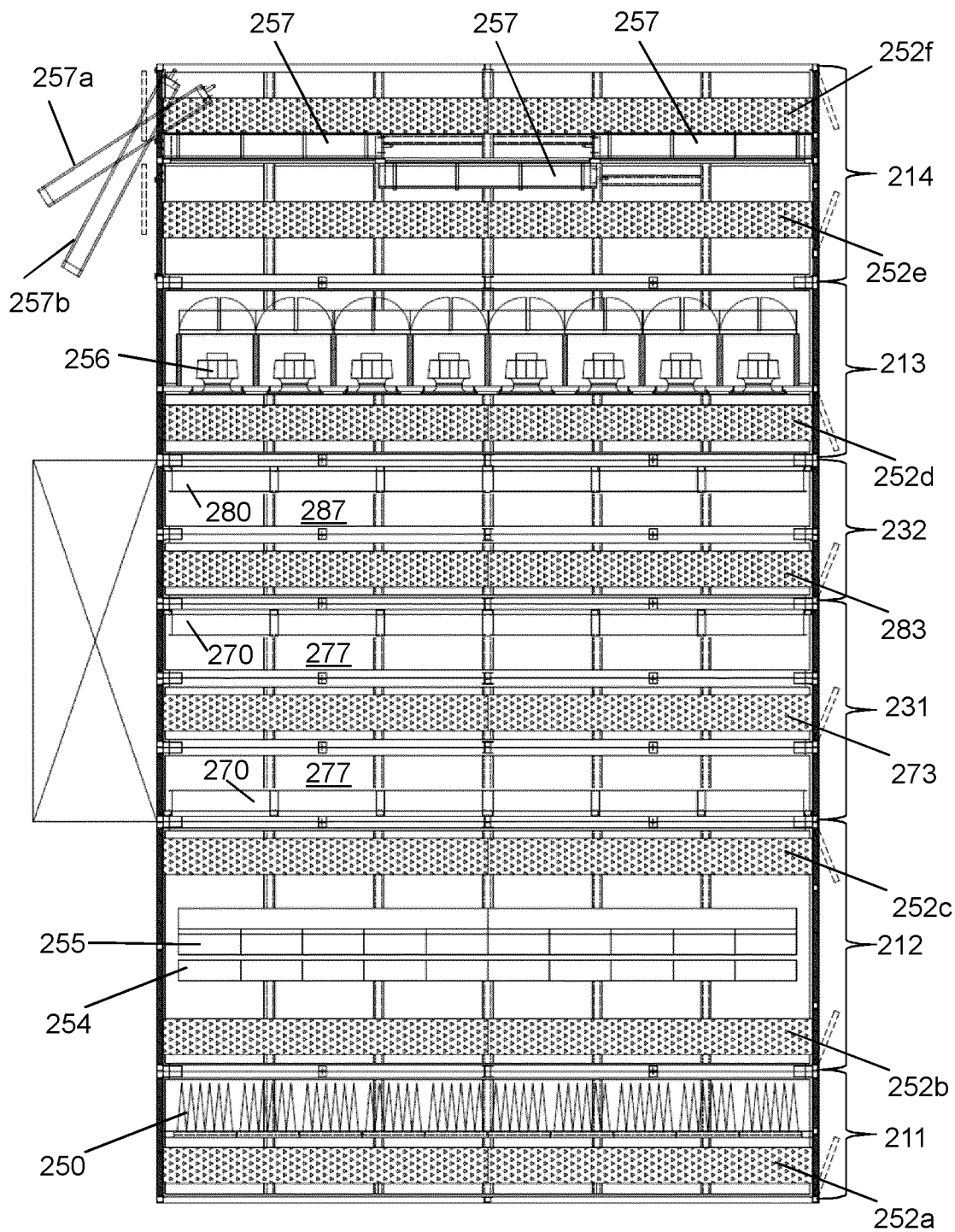
FIG. 14 shows a plan view of the upper deck of the IDAHU of FIG. 4.

FIG. 14 shows a plan view of the upper deck 202 of the IDAHU 201 of FIG. 4. The modules and components of the upper deck 202 are labelled with the same reference numerals used in FIGS. 4 to 13. The three DX condenser coil panels 257 in each of the two rows of condenser coil panels 257 (positioned one row above the other row, see FIG. 8) have a staggered arrangement with the central DX condenser coil panels 257 of each row offset upstream from the outer condenser coil panels 257 of each row. Having the condenser coil panels 257 offset allows convenient removal of each panel from one side of the upper deck 202 of the IDAHU 201 for maintenance or replacement. For example, a central condenser coil panels 257 can be moved along the row of condenser coil panels 257 without having to move an outer condenser coil panels 257. Once at an end of the row of condenser coil panels 257, an condenser coil panels 257 can be moved out of the IDAHU, for example by pivoting the panel through the positions indicated schematically in FIG. 14 by numerals 257a and 257b. To allow removal of any of the heat tube panels 270, 280 of the first and second heat tube modules 231, 232, adjustable separating baffles 277, 287 can be operated to widen the opening between the sections of external air flow path 271, 281 of the upper deck 202 and the sections of the internal air flow path 272, 282 of the lower deck 203 adjacent to the heat tube panel 270, 280 to be removed allowing it to move out of the row of heat tube panels 270, 280. Once the heat tube panel 270, 280 has moved out of the row of heat tube panels 270, 280, it can be moved along the row (with operation of further adjustable separating baffles 277, 287) to the side of the IDAHU.

Figure 15:
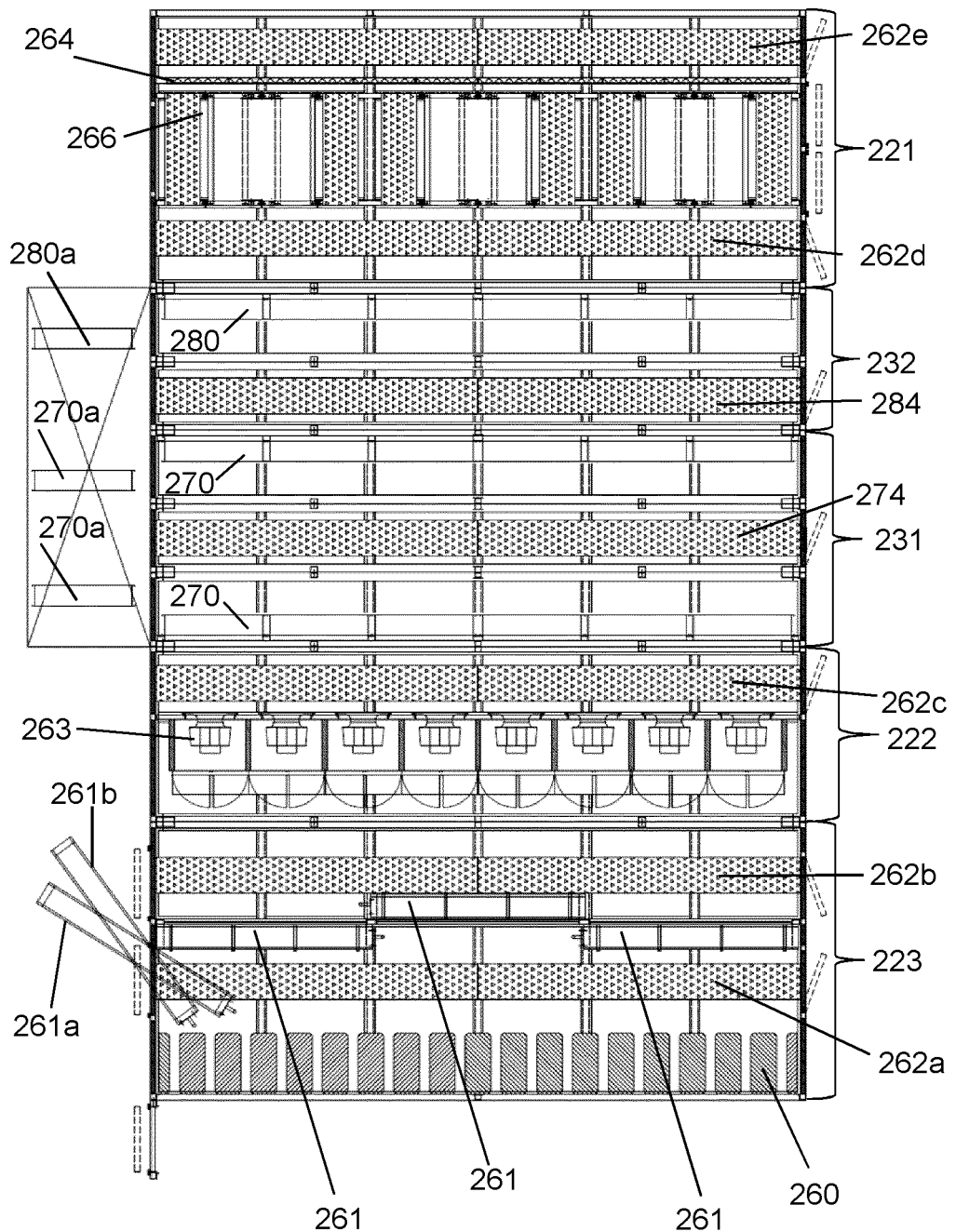
FIG. 15 shows a plan view of the lower deck of the IDAHU of FIG. 4.

FIG. 15 shows a plan view of the lower deck 203 of the IDAHU 201 of FIG. 4. The modules and components of the lower deck 203 are labelled with the same reference numerals used in FIGS. 4 to 13. The three DX evaporator coil panels 261 in each of the two rows of evaporator coil panels 261 (positioned one row above the other row, see FIG. 9) have a staggered arrangement with the central DX evaporator coil panels 261 of each row offset upstream from the outer evaporator coil panels 261 of each row. Having the evaporator coil panels 261 offset allows convenient removal of each panel from one side of the lower deck 203 of the IDAHU 201 for maintenance or replacement. For example, a central evaporator coil panel 261 can be moved along the row of evaporator coil panels 261 without having to move an outer evaporator coil panel 261. Once at an end of the row of evaporator coil panels 261, an evaporator coil panel 261 can be moved out of the IDAHU, for example by pivoting the panel through the positions indicated schematically in FIG. 15 by numerals 261a and 261b. Schematic representations of exemplary positions of heat tube panels 270, 280 removed from the IDAHU 201 (as described above in the description of FIG. 14) are indicated by numerals 270a and 280a in FIG. 15.

Figure 16:
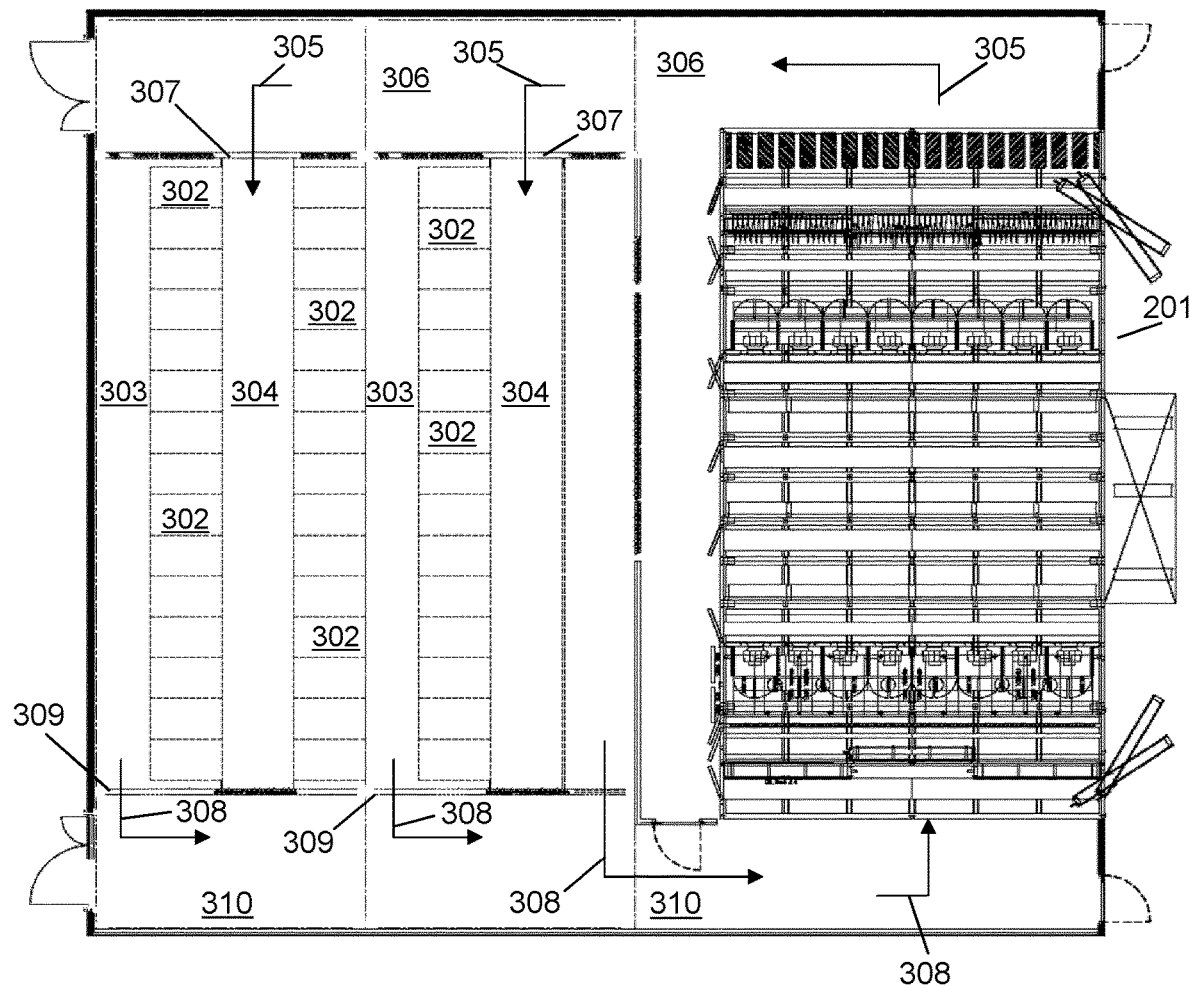
FIG. 16 shows a plan view of a first embodiment of a data centre comprising the IDAHU of FIG. 4.

FIG. 16 shows a plan view of a first embodiment of a data centre 301 comprising the IDAHU 201 of FIG. 4. The upper and lower decks of the IDAHU 201 have been superimposed in the plan view of FIG. 16. The data centre 301 comprises server racks 302 arranged in rows separated by interleaved hot aisles 303 and cold aisles 304. In operation, cooling air (indicated by arrows 305) exits the IDAHU 201 into a cold supply corridor 306 and passes through louvered doors 307 into the cold aisles 304. The cooling air passes through the server racks 302 into hot aisles 303, extracting heat from the servers in the server racks 302. The hot air (indicated by arrows 308) passes from the hot aisles 303 through vents 309 into a hot air return corridor 310 to return to the IDAHU 201.

Figure 17:
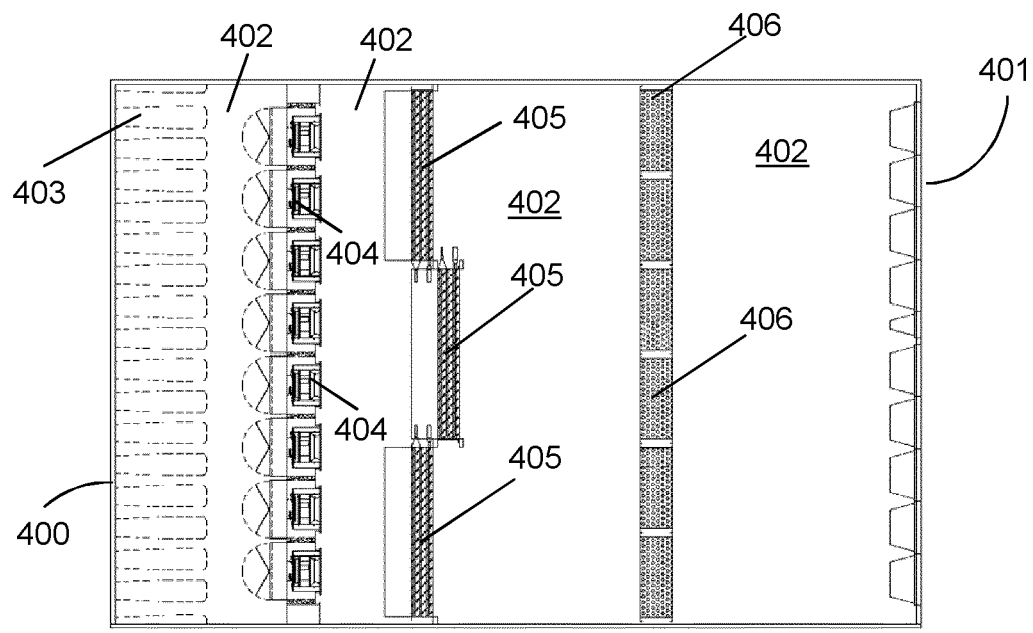
FIG. 17 shows a schematic plan view of an external air deck of a fourth embodiment of an IDAHU.

FIG. 17 shows a schematic plan view of an external air deck 400 of a fourth embodiment of an IDAHU 401, the external air deck defining an external air flow path 402. The IDAHU 401 comprises a plurality of bag filters 403 arranged in a row across the external air flow path 402, a plurality of fans 404 arranged in a row across the external air flow path 402 downstream of the bag filters 403, three DX condenser coil panels 405 arranged in a staggered row across the external air flow path 402 downstream of the fans 404 (the central condenser coil panel 405 being offset downstream from the two outer condenser coil panels 405), and six heat tube panels 406 arranged in a single row across the external air flow path 402 downstream of the DX condenser panels 405. Each heat tube panel 406 comprises eight rows of parallel, vertically oriented individual heat tubes.

Figure 18:
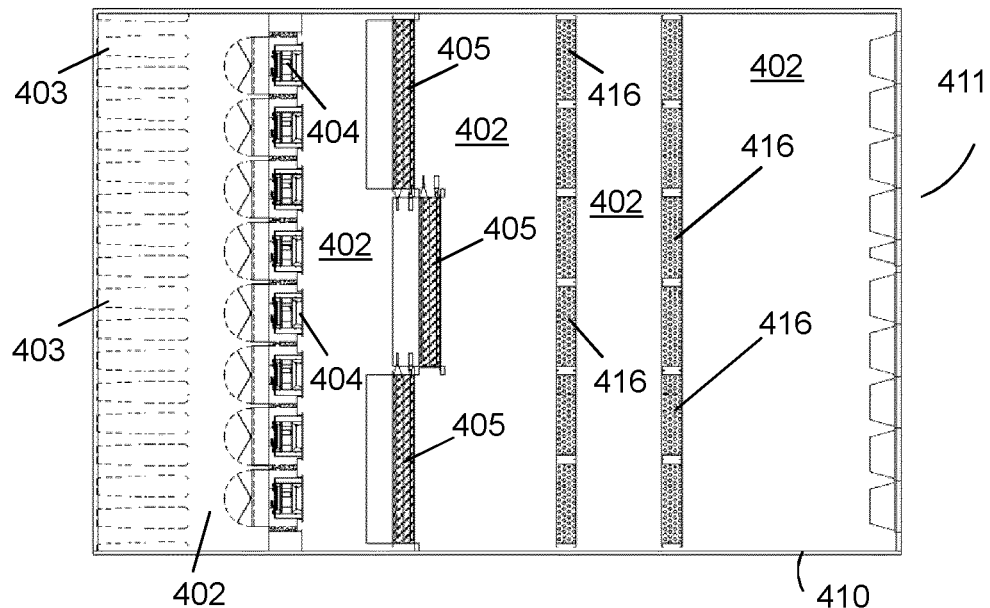
FIG. 18 shows a schematic plan view of an external air deck of a fifth embodiment of an IDAHU.

FIG. 18 shows a schematic plan view of an external air deck 410 of a fifth embodiment of an IDAHU 411. The parts of the IDAHU 411 that are the same as for the IDAHU 401 of FIG. 17 are labelled with the same reference numerals. The IDAHU 411 comprises twelve heat tube panels 416 arranged in two parallel rows of heat tube panels 416 across the external air flow path 402, the rows being separated by a gap to allow personnel access to the heat tube panels 416. Each heat tube panel 416 comprises four rows of parallel, vertically oriented individual heat tubes.

Figure 19:
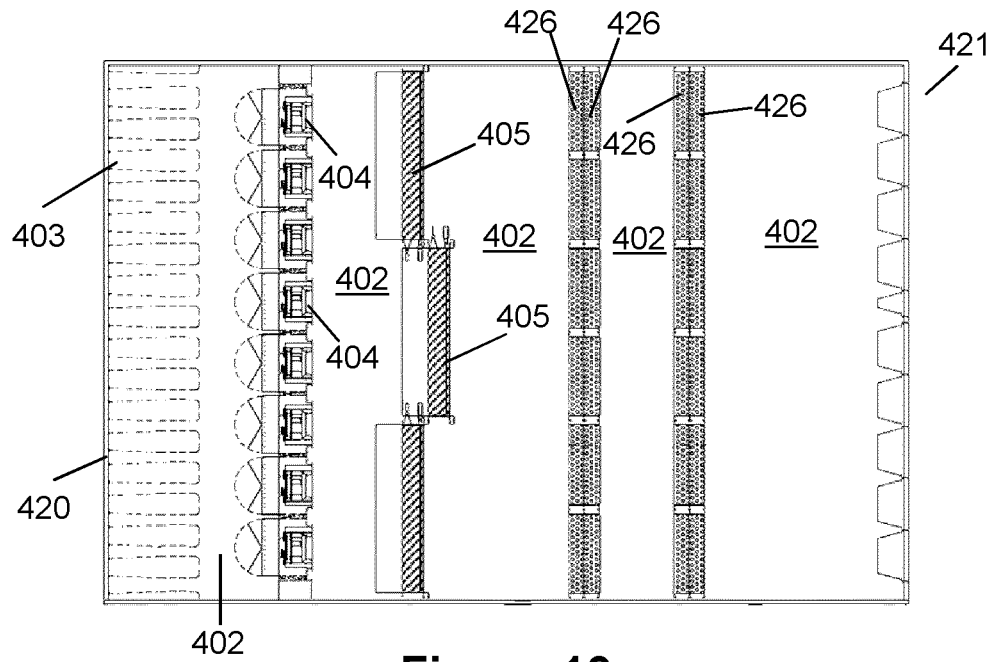
FIG. 19 shows a schematic plan view of an external air deck of a sixth embodiment of an IDAHU.

FIG. 19 shows a schematic plan view of an external air deck 420 of a sixth embodiment of an IDAHU 421. The parts of the IDAHU 421 that are the same as for the IDAHU 401 of FIG. 17 are labelled with the same reference numerals. The IDAHU 421 comprises twenty four heat tube panels 426 arranged in four parallel rows of heat tube panels 426 across the external air flow path 402. The four rows of heat tube panels 426 are arranged in two back to back pairs of rows with each pair of rows being separated by a gap to allow personnel access to the heat tube panels 426. Each heat tube panel 426 comprises two rows of parallel, vertically oriented individual heat tubes.

Figure 20:
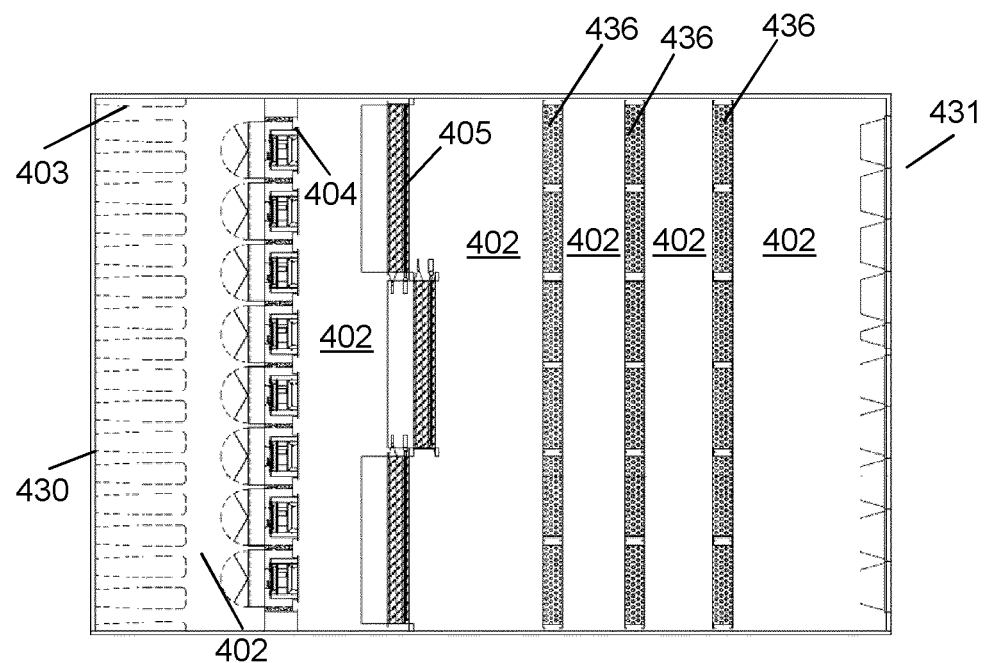
FIG. 20 shows a schematic plan view of an external air deck of a seventh embodiment of an IDAHU.

FIG. 20 shows a schematic plan view of an external air deck 430 of a seventh embodiment of an IDAHU 431. The parts of the IDAHU 431 that are the same as for the IDAHU 401 of FIG. 17 are labelled with the same reference numerals. The IDAHU 431 comprises eighteen heat tube panels 436 arranged in three parallel rows of heat tube panels 436 across the external air flow path 402, the rows each being separated by a gap to allow personnel access to the heat tube panels 436. Each heat tube panel 436 comprises four rows of parallel, vertically oriented individual heat tubes.

Figure 21:
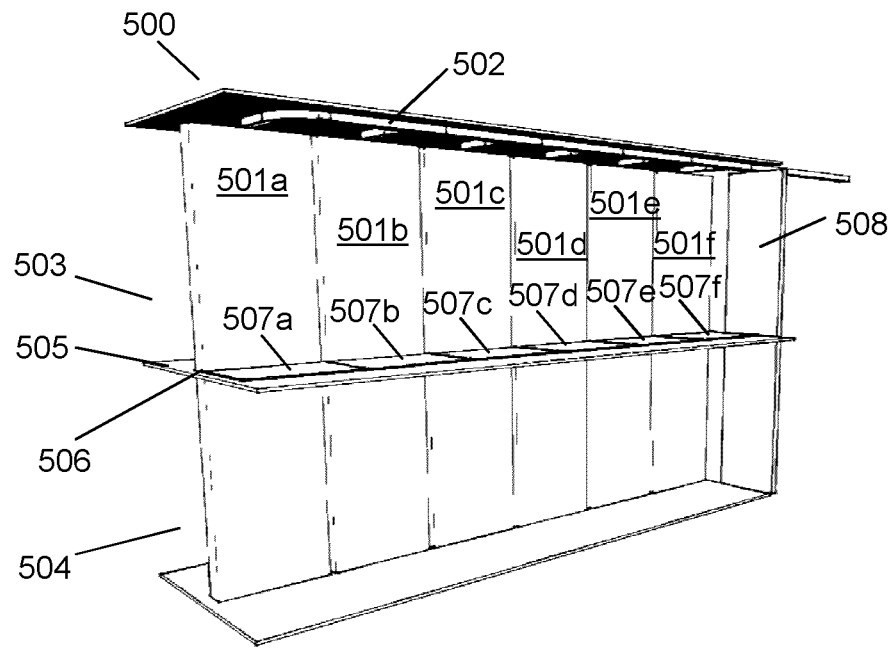
FIG. 21 shows a cut-away perspective view of a heat tube module of an eighth embodiment of an IDAHU.

FIG. 21 shows a cut-away perspective view of a heat tube module 500 of an eighth embodiment of an IDAHU (not shown). The heat tube module 500 comprises six heat tube panels 501a to 501f arranged in a row across the heat tube module 500. Each heat tube panel 501 is slidably mounted on a rail system 502. The heat tube module 500 defines a section 503 of the external air flow path of the IDAHU and a section 504 of the internal air flow path of the IDAHU, the sections 503, 504 being separated by a floor section 505. Each heat tube panel 501 extends through an opening 506 in the floor 505 such that a first, upper section of the heat tube panel 501 extends into the external air flow path section 503 and a second, lower section of the heat tube panel 501 extends into the internal air flow path section 504. The floor 505 comprises adjustable separating baffles 507a to 507f that maintains separation between the sections of air flow path 503, 504 when the heat tube panels 501 are in their normal operating position (i.e. the panels 501 are arranged in a row across the heat tube module 500, as shown in FIG. 21). Each of the six heat tube panels 501a to 501f has a corresponding adjustable separating baffle 507a to 507f, the adjustable separating baffles 507 being arranged in a row across the heat tube module 500 adjacent to the row of heat tube panels 501. The heat tube module 500 also comprises a removable side panel 508 also slidably mounted on the rail system 502 and being operable to allow one or more of the heat tube panels 501 to be removed from the heat tube module 500.

Figure 21A:
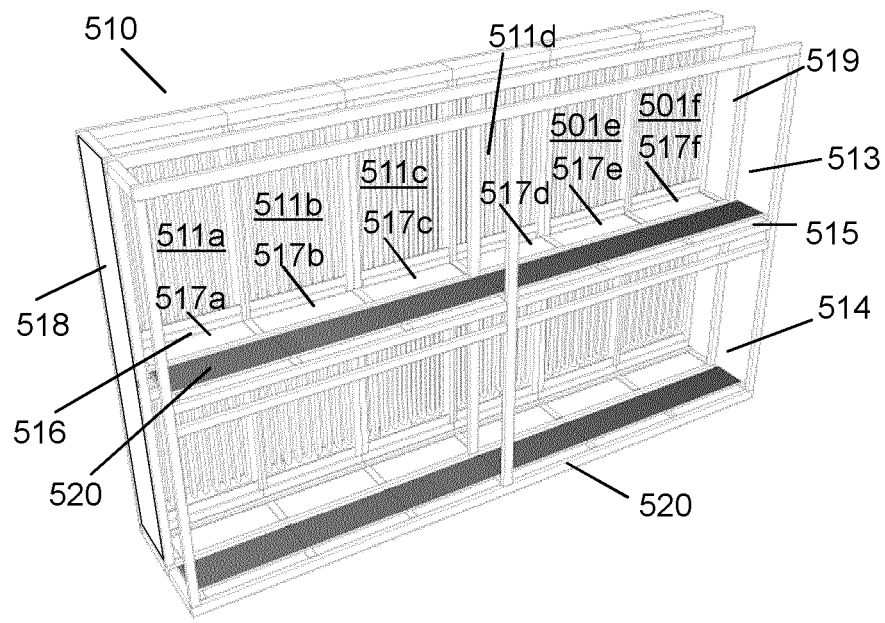
FIG. 21a shows a cut-away perspective view of a heat tube module of a ninth embodiment of an IDAHU.

FIG. 21a shows a cut-away perspective view of a heat tube module 510 of a ninth embodiment of an IDAHU (not shown). The heat tube module 510 comprises six heat tube panels 511a to 511f arranged in a row across the heat tube module 510. Each heat tube panel 511 comprises roller bearings (not shown) on the bottom of the panel frame allowing each panel to be moved along the lower floor of the heat tube module 510. The heat tube module 510 defines a section 513 of the external air flow path of the IDAHU and a section 514 of the internal air flow path of the IDAHU, the sections 513, 514 being separated by a floor section 515. Each heat tube panel 511 extends through an opening 516 in the floor 515 such that a first, upper section of the heat tube panel 511 extends into the external air flow path section 513 and a second, lower section of the heat tube panel 511 extends into the internal air flow path section 514. The floor 515 comprises adjustable separating baffles 517a to 517f that maintain separation between the sections of air flow path 513, 514 when the heat tube panels 511 are in their normal operating position (i.e. the panels 511 are arranged in a row across the heat tube module 510, as shown in FIG. 21a). Each of the six heat tube panels 511a to 511f has a corresponding adjustable separating baffle 517a to 517f, the adjustable separating baffles 517 being arranged in a row across the heat tube module 510 adjacent to the row of heat tube panels 511. The heat tube module 510 also comprises a removable side panel 518 bolted to the frame 519 of the heat tube module 510. The removable side panel 518 can be unbolted from the frame 519 to allow one or more of the heat tube panels 511 to be removed from the heat tube module 510. The heat tube module 510 is provided with reinforced walkways 520 to facilitate personnel access to the heat tube panels 511.

Figure 22:
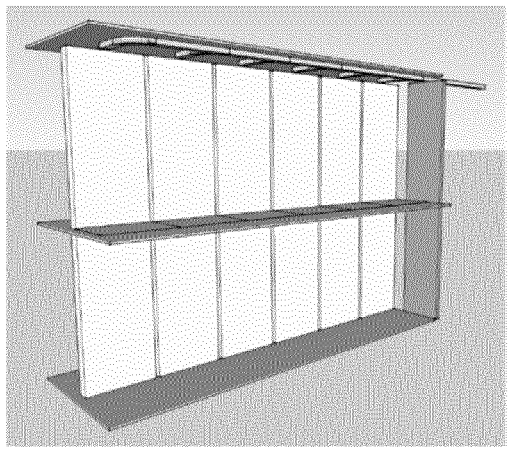
FIG. 22 shows a sequence of cut-away perspective views of the heat tube module of FIG. 21.
Figure 22:
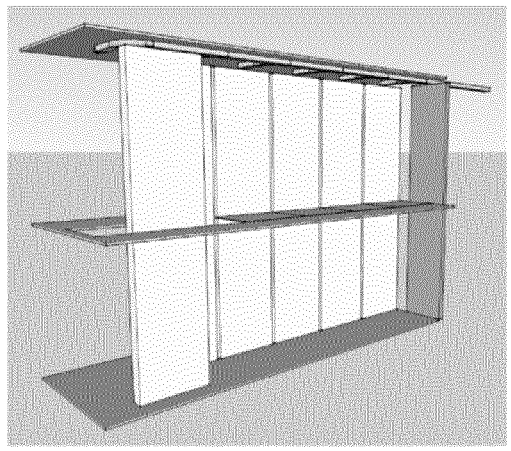
Figure 22:
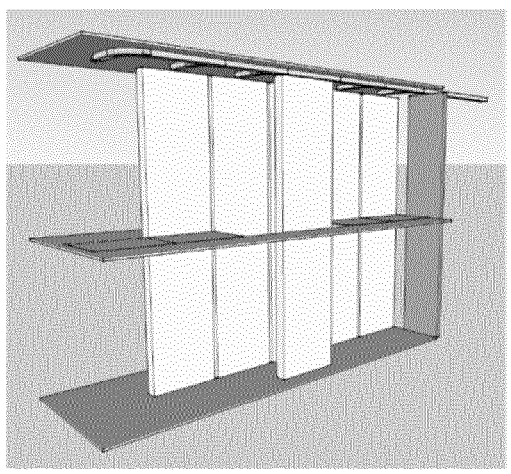
Figure 22:
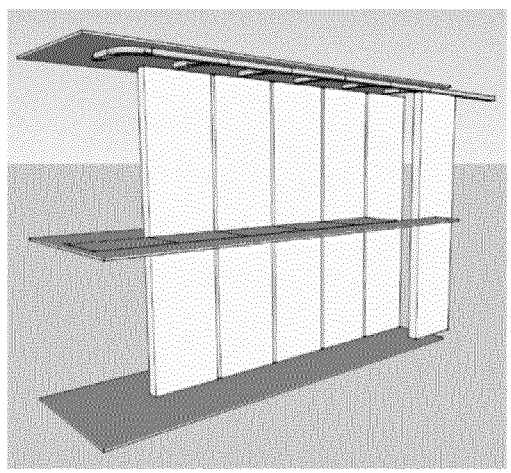

FIG. 22 shows a sequence of cut-away perspective views (i) to (iv) of the heat tube module 500 of FIG. 21, the sequence depicting the removal of heat tube panel 501a from the heat tube module 500. The parts of the heat tube module 500 of FIG. 22 are referred to using the same reference numerals used for FIG. 21. In view (i) of FIG. 22, the heat tube module 500 is arranged in its normal operating configuration, with the six heat tube panels 501a to 501f arranged in a row across the heat tube module 500, and with the adjustable separating baffles 507a to 507f partially closed to maintain separation between the external and internal air flow sections 503, 504 of the heat tube module 500 in cooperation with heat tube panels 501a to 501f. View (ii) of FIG. 22 shows heat tube panel 501a being moved out of the row of heat tube panels 501. In view (ii) of FIG. 22, adjustable separating baffles 507a and 507b have been fully opened to allow heat tube panel 501a to be moved out of the row of heat tube panels and partially along the row in front of heat tube panel 501b. Heat tube panel 501a has been moved to this new position by sliding it out of and then along the row of heat tube panels 501 on the rail system 502. View (iii) of FIG. 22 shows heat tube panel 501a being moved further along in front of the row of heat tube panels 501. In view (iii) of FIG. 22, adjustable separating baffles 507c and 507d have been fully opened to allow heat tube panel 501a to be moved to a position in front of heat tube panels 501c and 501d by sliding heat tube panel 501a along the rail system 502. Adjustable separating baffle 507a has been fully closed to maintain separation between the external and internal air flow path sections 503, 504 now that heat tube panel 501a has been moved out of the opening 506 provided for heat tube panel 501a when it is in its normal operating position. Adjustable separating baffle 507b has been partially closed to maintain separation between the external and internal air flow path sections 503, 504 in cooperation with heat tube panel 501b, which panel is in its normal operating position. View (iv) of FIG. 22 shows heat tube panel 501a being removed from the heat tube module 500. In view (iv) of FIG. 22, adjustable separating baffle 507f and adjustable side panel 508 have been opened to allow heat tube panel 501a to be moved into a position partially in front of heat tube panel 501f and partially out of the heat tube module 500 by sliding heat tube panel 501a further along the rail system 502. The adjustable side panel 508 has been opened by sliding it along the rail system 502 which extends out of the heat tube module 500. Adjustable separating baffles 507c and 507d have been moved back to their partially closed position to maintain separation between the external and internal air flow sections 503, 504 in cooperation with heat tube panels 501c and 501d. It will be appreciated that the sequential operation of the adjustable separating baffles 507a to 507f as the heat tube panel 501a is moved out of the heat tube module 501 minimises contamination between external air in the external air flow section 503 and internal air in the internal air flow section 504 of the heat tube module 500.

Figure 22A:
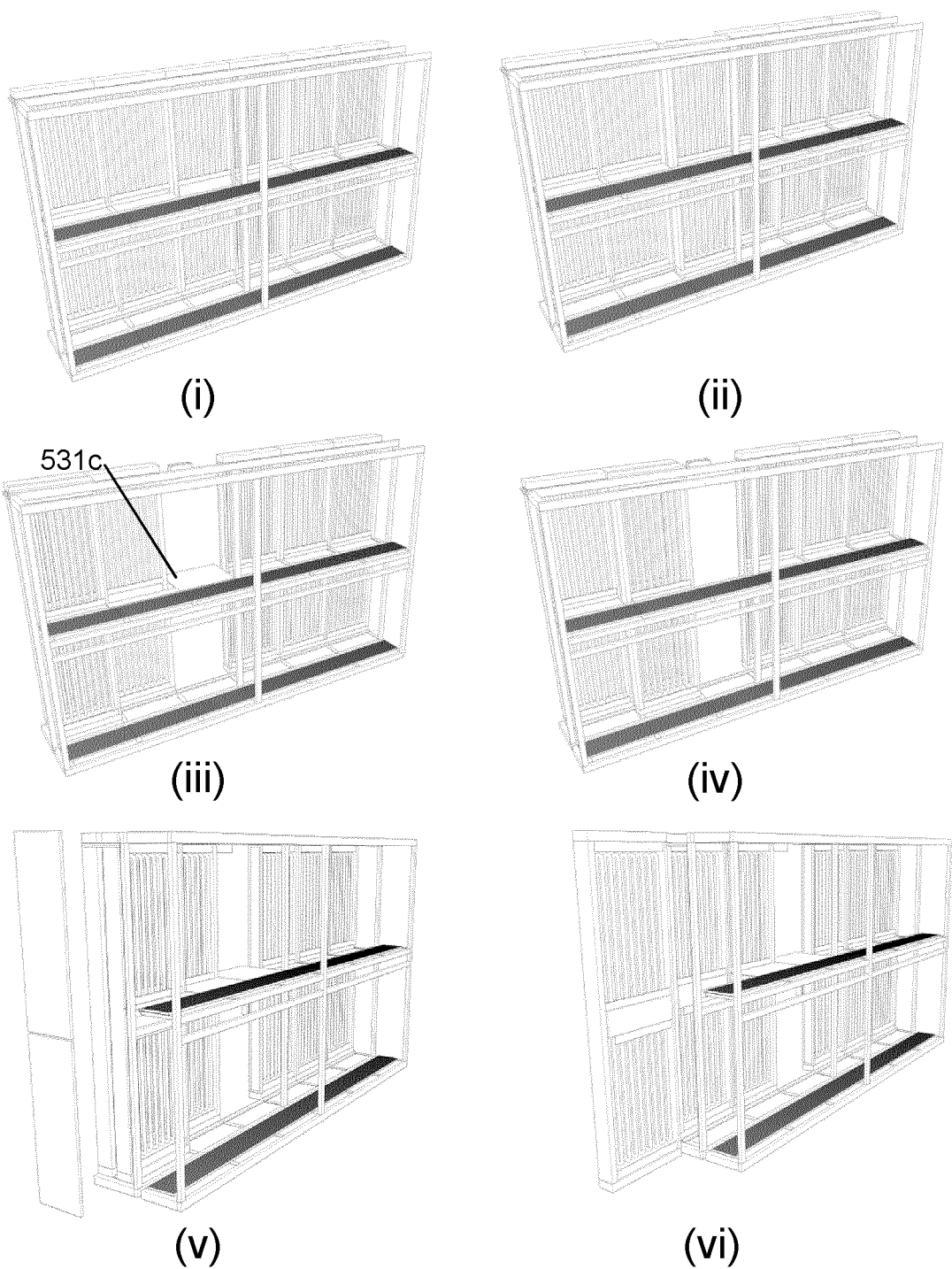

FIG. 22a shows a sequence of cut-away perspective views (i) to (vi) of the heat tube module 510 of FIG. 21a, the sequence depicting the removal of heat tube panel 511a from the heat tube module 510. The parts of the heat tube module 510 of FIG. 22a are referred to using the same reference numerals used for FIG. 21a. In view (i) of FIG. 22a, the heat tube module 510 is arranged in its normal operating configuration, with the six heat tube panels 511a to 511f arranged in a row across the heat tube module 510, and with the adjustable separating baffles 517a to 517f partially closed to maintain separation between the external and internal air flow sections 513, 514 of the heat tube module 510 in cooperation with heat tube panels 511a to 511f. View (ii) of FIG. 22a shows heat tube panel 511c being moved out of the row of heat tube panels 511. In view (ii) of FIG. 22a, adjustable separating baffle 517c has been fully opened to allow heat tube panel 511c to be moved forwards out of the row of heat tube panels 511. Heat tube panel 511c has been moved to this new position by sliding it on its roller bearings (not shown) over the lower floor of the heat tube module 510 forwards out of the row of heat tube panels 511. Once heat tube panel 511c has been moved forward, an opening baffle (not shown) is closed behind the heat tube panel 511c to maintain separation between the internal and external air flow sections 513, 514. View (iii) of FIG. 22a shows heat tube panel 511c being moved along in front of the row of heat tube panels 511. In view (iii) of FIG. 22a, adjustable separating baffle 517c and opening baffle 531c have been closed to maintain separation between the internal and external air flow sections 513, 514, and adjustable separating baffle 517b has been opened to allow heat tube panel 511c to move across in front of heat tube panel 511b. View (iv) of FIG. 22a shows heat tube panel 511c moved further along in front of the row of heat tube panels 511. In view (iv) of FIG. 22a, adjustable separating baffle 517b is shown in the open position, having not yet been closed since heat tube panel 511c was moved across in front of heat tube panel 511a. In view (v) of FIG. 22a, removable side panel 518 has been unbolted from the frame 519 of the heat tube module 510 to allow heat tube panel 511c to be removed from the heat tube module 510. In view (v) of FIG. 22a, adjustable separating baffle 517b has been closed to maintain separation between the internal and external air flow sections 513, 514. In view (vi) of FIG. 22a, heat tube panel 511c has been removed from the heat tube module 510.

Figure 23:
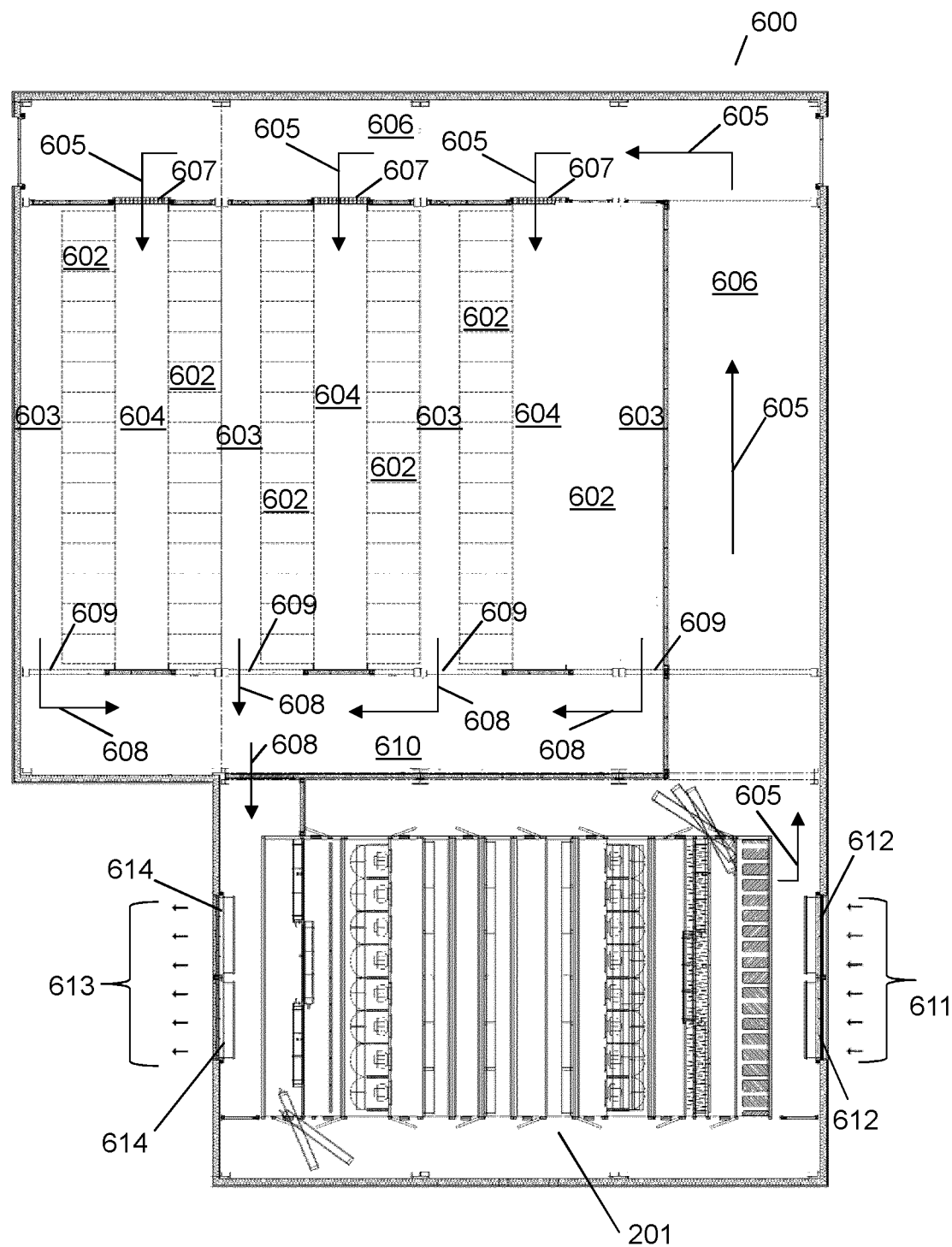
FIG. 23 shows a plan view of a second embodiment of a data centre comprising the IDAHU of FIG. 4.

FIG. 23 shows a plan view of a second embodiment of a data centre 600 comprising the IDAHU 201 of FIG. 4. The upper and lower decks of the IDAHU 201 have been superimposed in the plan view of FIG. 16. The data centre 600 comprises server racks 602 arranged in rows separated by interleaved hot aisles 603 and cold aisles 604. In operation, cooling air (indicated by arrows 605) exits the IDAHU 201 into a cold supply corridor 606 and passes through louvered doors 607 into the cold aisles 604. The cooling air passes through the server racks 602 into hot aisles 603, extracting heat from the servers in the server racks 602. The hot air (indicated by arrows 608) passes from the hot aisles 603 through vents 609 into a hot air return corridor 610 to return to the IDAHU 201. External air (indicated by arrows 611) from outside the data centre is drawn into IDAHU 201 through external air inlets 612, and once it has picked up heat from the IDAHU 201, it is returned to outside the data centre (indicated by arrows 613) through external air exhausts 614.

Figure 23A:
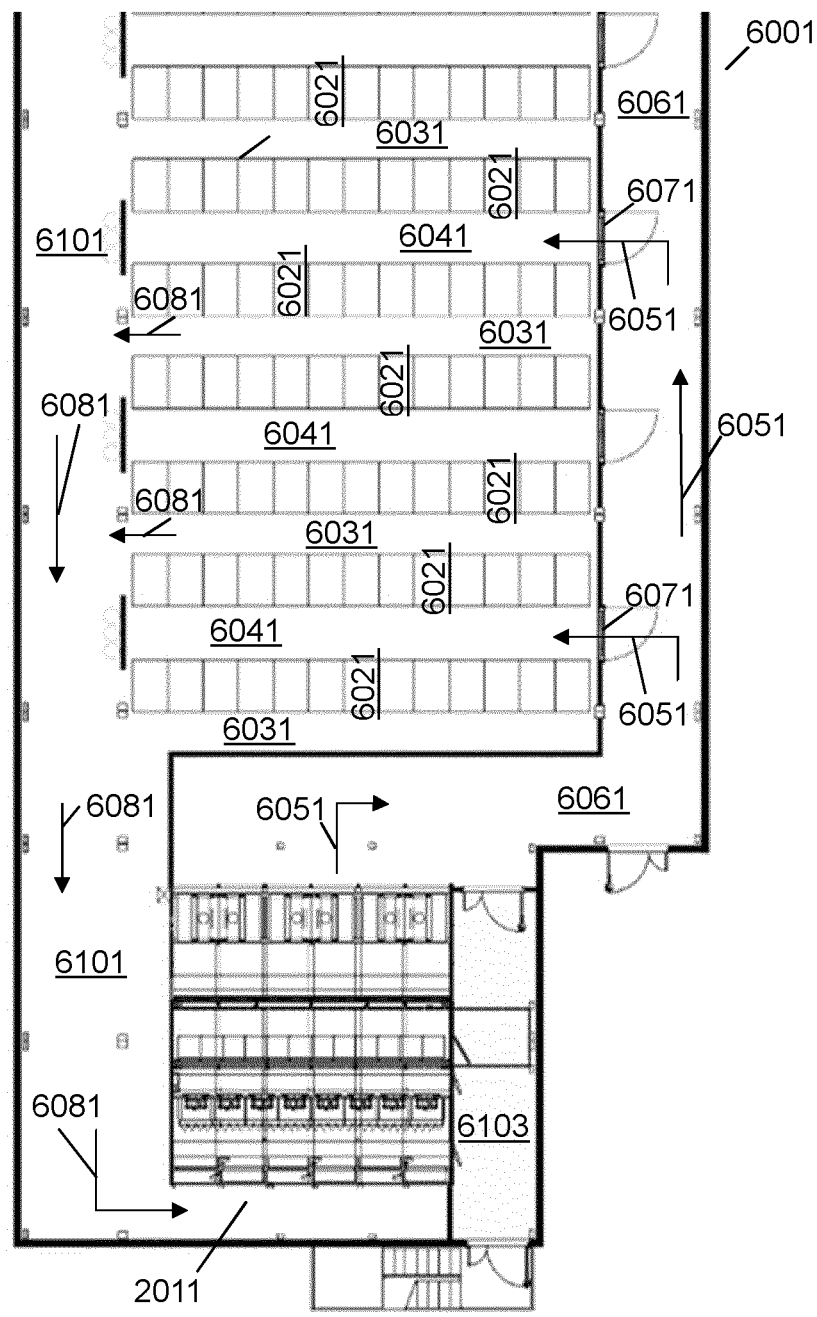
FIG. 23a shows a plan view of a third embodiment of a data centre comprising the IDAHU of FIG. 4a, the plan view showing the lower, internal air deck of the IDAHU.

FIG. 23a shows a plan view of a third embodiment of a data centre comprising the IDAHU of FIG. 4a, the plan view showing the lower, internal air deck of the IDAHU. The data centre 6001 comprises server racks 6021 arranged in rows separated by interleaved hot aisles 6031 and cold aisles 6041. In operation, cooling air (indicated by arrows 6051) exits the IDAHU 2011 into a cold supply corridor 6061 and passes through louvered doors 6071 into the cold aisles 6041. The cooling air passes through the server racks 6021 into hot aisles 6031, extracting heat from the servers in the server racks 6021. The hot air (indicated by arrows 6081) passes from the hot aisles 6031 into a hot air return corridor 6101 to return to the IDAHU 2011. The IDAHU 2011 also comprises a service corridor 6103 along one side of the IDAHU 6103 providing side access to the IDAHU components. More particularly, the service corridor 6103 provides access to the heat tube panels of the IDAHU 2011 allowing convenient removal form the IDAHU.

Figure 23B:
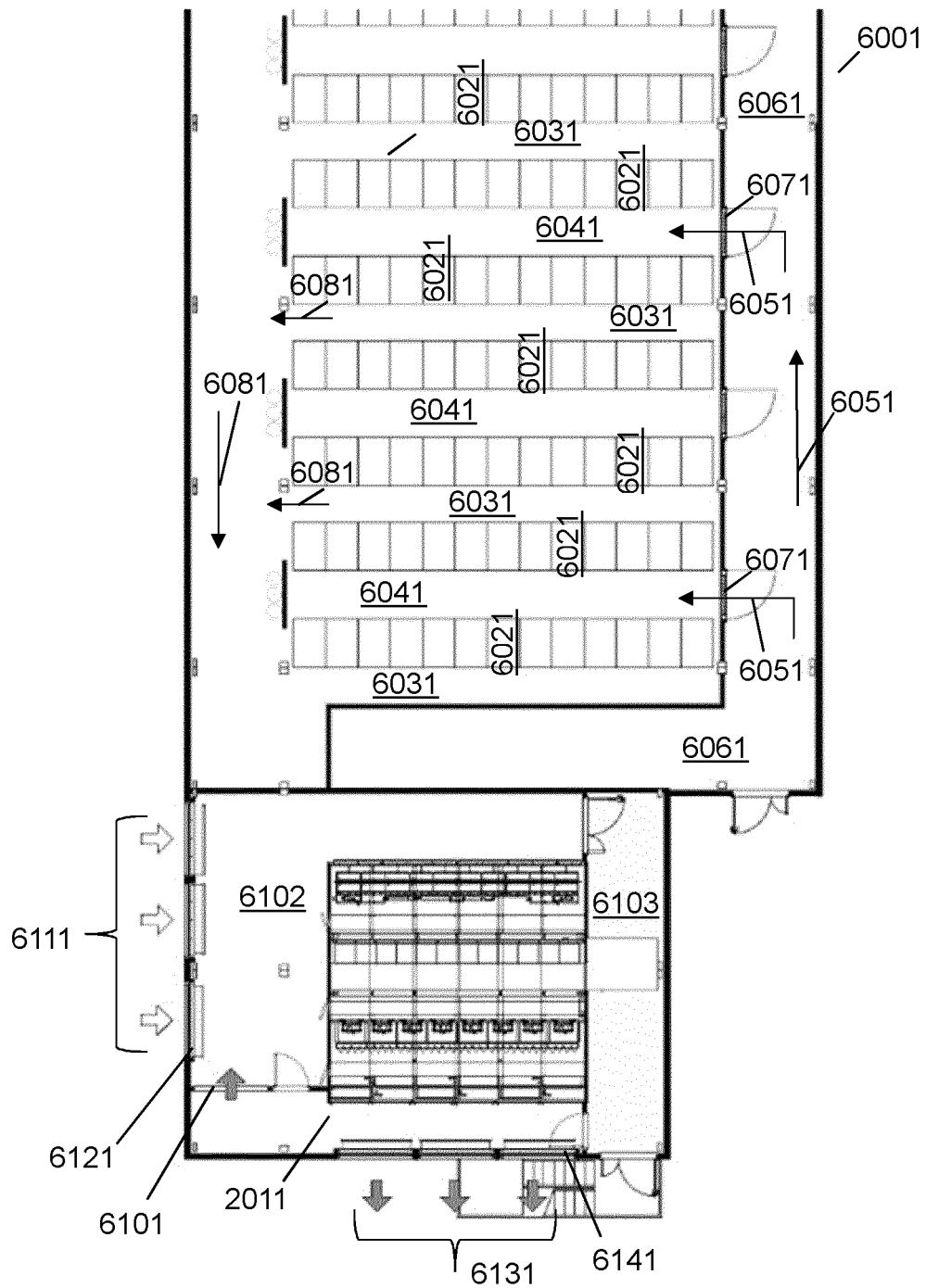
FIG. 23b shows another plan view of the third embodiment of a data centre comprising the IDAHU of FIG. 4a, the plan view showing the upper, external air deck of the IDAHU.

FIG. 23b shows another plan view of the third embodiment of a data centre comprising the IDAHU of FIG. 4a, the plan view showing the upper, external air deck of the IDAHU. The parts of FIG. 23b also shown in FIG. 23a are labelled using the same reference numerals. In operation, external air (indicated by arrows 6111) from outside the data centre is drawn into IDAHU 2011 through external air inlets 6121, and once it has picked up heat from the IDAHU 2011, it may be returned to outside the data centre (indicated by arrows 6131) through external air exhausts 6141. The IDAHU 2011 also comprises a controllable recirculation vent 6101 for allowing recirculation of warm air from the hot side of the IDAHU 2011 back to the cold side. In other words, the controllable recirculation vent 6101 can be operated to recirculate warm outside air that has been used to extract heat from the heat tubes (air that would otherwise exit the IDAHU through external air exhausts 6141) back through the IDAHU again. It may be that the IDAHU 2011 is operable in any one of three modes comprising: 1) a full outside air mode, in which the controllable recirculation vent 6101 is closed and the external air inlets 6121 and the external air exhausts 6141 are open, thus preventing any recirculation from the hot side to the cold side of the IDAHU 2011; 2) a partial recirculation mode in which the recirculation vent 6101, the external air inlets 6121 and the external air exhausts 6141 are at least partially open, thus allowing some warm air to recirculate from the hot side to the cold side of the IDAHU 2011 and mix with external air in the mixing chamber 6102; and 3) a full recirculation mode in which the controllable recirculation vent 6101 is fully open and the external air inlets 6121 and the external air exhausts 6141 are closed, thus allowing all of the warm air to recirculate from the hot side to the cold side of the IDAHU 2011 without any admission of external air.

Figure 24:
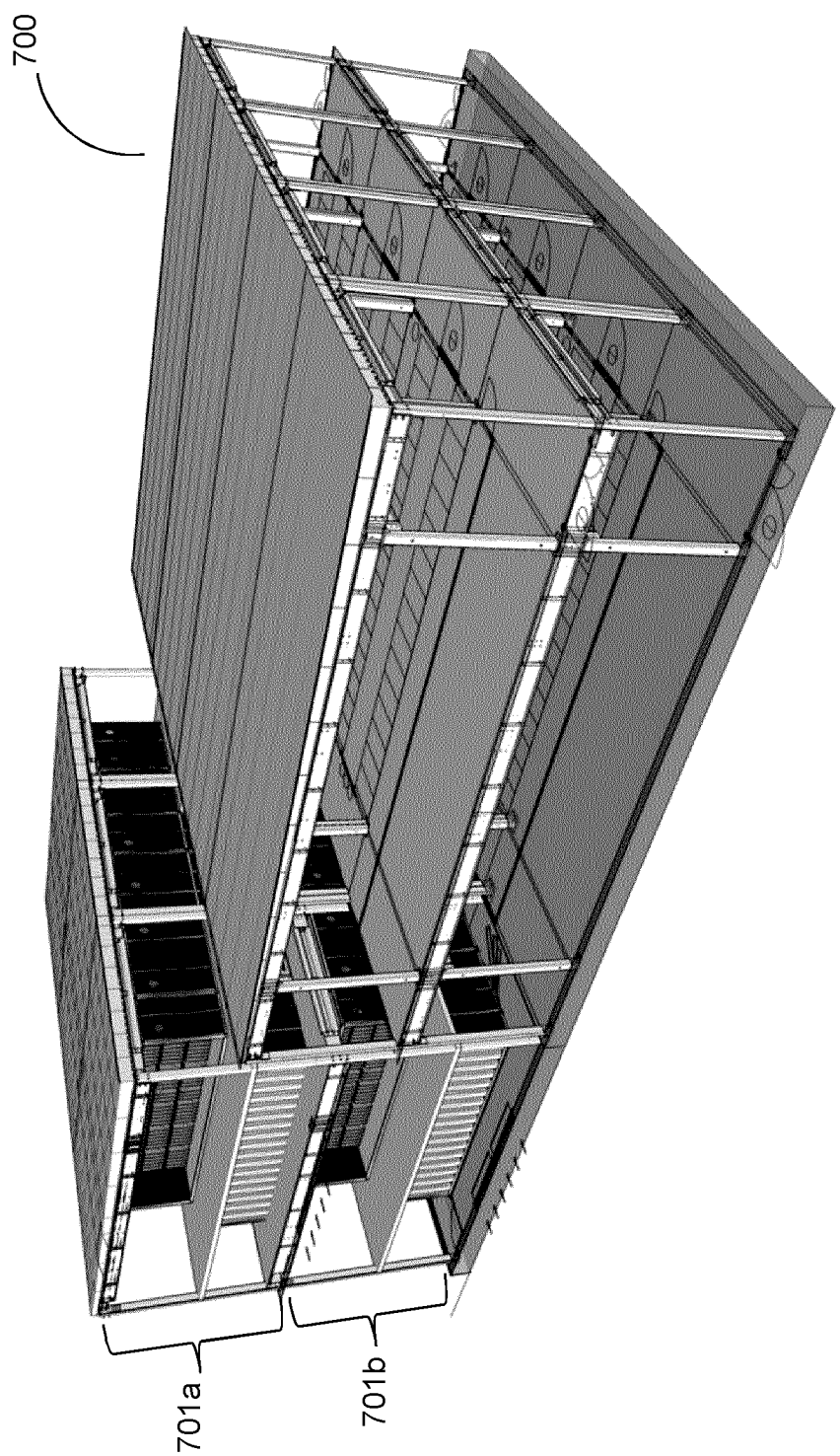
FIG. 24 shows a cutaway perspective view of a fourth embodiment of a data centre, the data centre being a two-story modular data centre.

FIG. 24 shows a cutaway perspective view of a fourth embodiment of a two-story modular data centre 700 comprising two IDAHUs 701a, 701b stacked one above the other. Each level of the data centre 700 has substantially the same layout as the data centre 600 of FIG. 23. In the data centre 700 of FIG. 24, each IDAHU 701a, 701b comprises a lower deck defining the internal air flow path and an upper deck defining the external air flow path.

Figure 25:
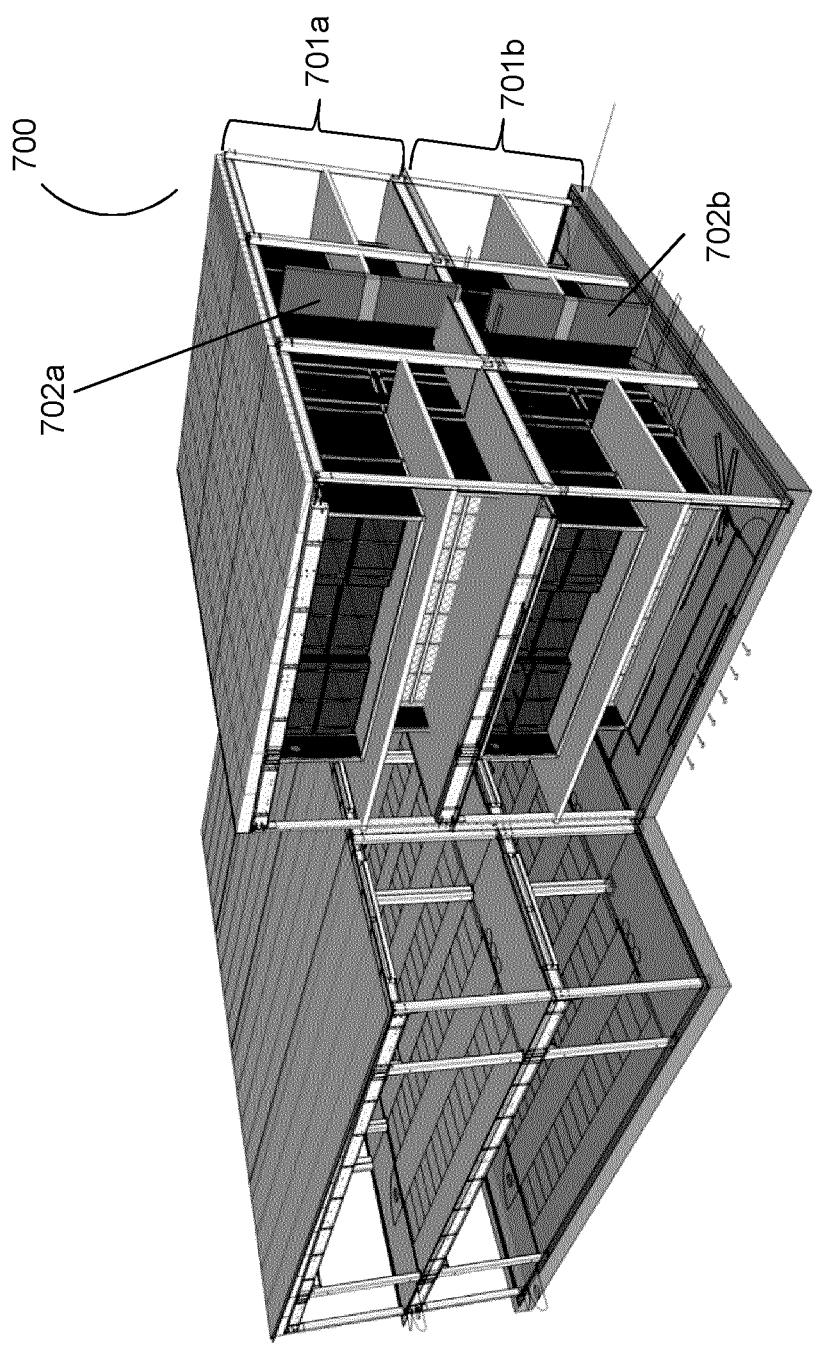
FIG. 25 shows an alternative cut away perspective view of the data centre of FIG. 24.

FIG. 25 shows an alternative cut away perspective view of the data centre 700 of FIG. 24. In both the IDAHUs 701a, 701b of the data centre 700, heat tube panels 702a, 702b are shown partially removed from the side of the IDAHU 701a, 701b (the partially removed position being approximately equivalent to the position of the heat tube panel 701a in view (iv) of FIG. 22).

Figure 26:
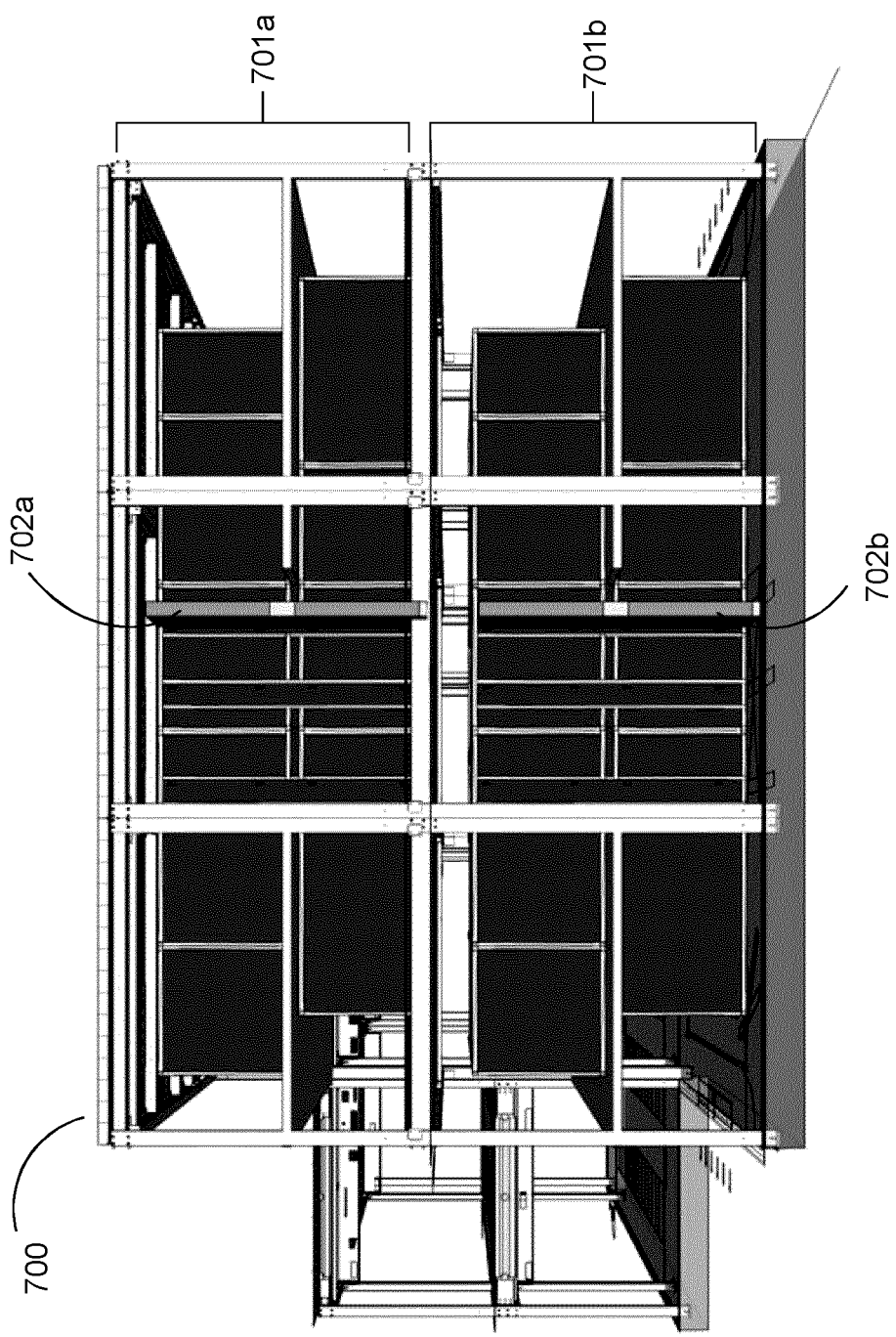
FIG. 26 shows an alternative cut away perspective view of the data centre of FIG. 24.

FIG. 26 shows an alternative cut away perspective view of the data centre 700 of FIG. 24. In both the IDAHUs 701a, 701b of the data centre 700, heat tube panels 702a, 702b are shown partially removed from the side of the IDAHU 701a, 701b (the partially removed position being approximately equivalent to the position of the heat tube panel 701a in view (iv) of FIG. 22).

Figure 27:
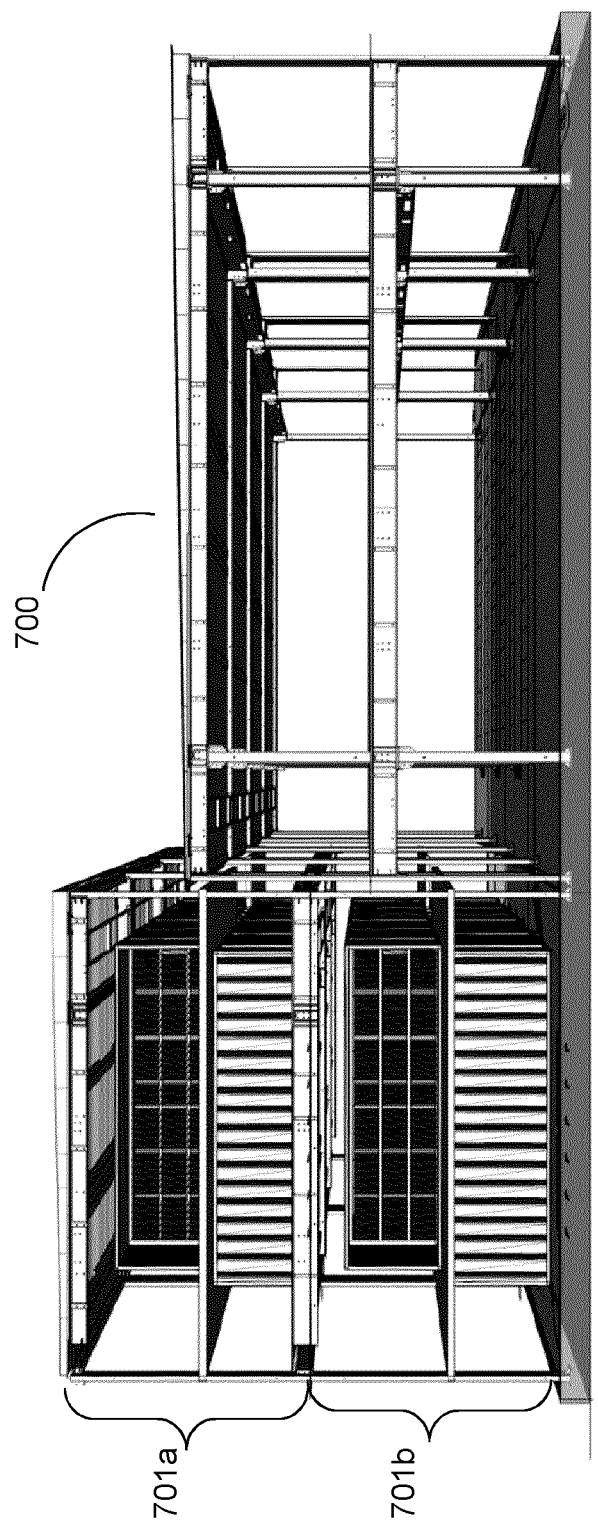
FIG. 27 shows an alternative cut away perspective view of the data centre of FIG. 24.

FIG. 27 shows an alternative cut away perspective view of the data centre 700 of FIG. 24.

Whilst the present invention has been described and illustrated with reference to particular embodiments, it will be appreciated by those of ordinary skill in the art that the invention lends itself to many different variations not specifically illustrated herein. By way of example only, certain possible variations will now be described. It may be that the humidification means is a spray humidifier, for example a water spray humidifier. It may be that one or more, for example all, of the heat tube panels are not removable heat tube panels.

The IDAHU of the embodiment may be referred to as an air optimiser unit. It will be appreciated the term "air optimiser unit" is used in the art to describe an air handling unit that seeks to change the characteristics of air to provide conditioned air having predefined characteristics. There may be a range of characteristics of air that are considered "optimised" in this context.

The following Clauses set out various combinations of subject matter which are considered to be within the scope of the present patent application:

Clause 1. An indirect air handling unit for a data centre, the indirect air handling unit comprising:
i) an external air flow path arranged to be in fluid communication with air outside the data centre; and ii) an internal air flow path arranged to be in fluid communication with air inside the data centre; wherein, the external air flow path is separated from the internal air flow path; wherein, the indirect air handling unit comprises:
a) a plurality of heat tubes, each heat tube having a first section extending into the external air flow path and a second section extending into the internal air flow path; and
b) at least one humidification means positioned in the external air flow path upstream of the plurality of heat tubes; and wherein, the at least one humidification means comprises a wetted matrix humidifier.

Clause 2. An indirect air handling unit according to clause 1 comprising an adjustable vent for allowing air flowing along the external air flow stream to be added to air flowing along the internal air flow stream during operation of the indirect air handling unit.

Clause 3. An indirect air handling unit according to clause 1 or clause 2, wherein the indirect air handling unit comprises at least one mechanical cooling means comprising at least one evaporator section positioned in the internal air flow path and/or at least one condenser section positioned in the external air flow path.

Clause 4. An indirect air handling unit according to clause 3, wherein the mechanical cooling means is a DX mechanical cooler, the evaporator section comprises at least one evaporator coil and/or the condenser section comprises at least one condenser coil.

Clause 5. An indirect air handling unit according to clause 3 or clause 4, wherein the evaporator section of the mechanical cooling means, if present, is detachable and/or wherein the condenser section of the mechanical cooling means, if present, is detachable.

Clause 6. An indirect air handling unit according to any preceding clause, wherein the internal air flow path is substantially horizontal and/or the external air flow path is substantially horizontal.

Clause 7. An indirect air handling unit according to any preceding clause, wherein the internal air flow path has a cross-sectional area of at least 5 m2 for at least 70% of the length of the internal air flow path and/or the external air flow path has a cross-sectional area of at least 5 m2 for at least 70% of the length of the external air flow path.

Clause 8. An indirect air handling unit according to any preceding clause, wherein the wetted matrix humidifier is a resilient wetted matrix humidifier.

Clause 9. An indirect air handling unit according to any preceding clause, wherein the indirect air handling unit comprises a plurality of heat tube panels and wherein each heat tube panel comprises a plurality of heat tubes.

Clause 10. An indirect air handling unit according to clause 9, wherein the plurality of heat tube panels is arranged in a plurality of rows.

Clause 11. An indirect air handling unit according to clause 9 or clause 10, wherein at least one of the heat tube panels is a removable heat tube panel.

Where in the foregoing description, integers or elements are mentioned which have known, obvious or foreseeable equivalents, then such equivalents are herein incorporated as if individually set forth. Reference should be made to the claims for determining the true scope of the present invention, which should be construed so as to encompass any such equivalents. It will also be appreciated by the reader that integers or features of the invention that are described as preferable, advantageous, convenient or the like are optional and do not limit the scope of the independent claims. Moreover, it is to be understood that such optional integers or features, whilst of possible benefit in some embodiments of the invention, may not be desirable, and may therefore be absent, in other embodiments.

The invention claimed is:

1. An indirect air cooler for cooling a data centre, wherein the indirect air cooler defines:
    i) an internal air flow path configured to receive interior air from an interior of the data centre and to return the interior air to the interior of the data centre, and
    ii) an external air flow path configured to receive external air from an exterior of the data centre and to return the external air to the exterior of the data centre,
        wherein the indirect air cooler comprises a plurality heat tube heat exchangers for exchanging heat between the interior air and the exterior air, wherein at least one of the plurality of heat tube heat exchangers is removable, and wherein the indirect air cooler comprises a baffle configured to maintain separation between the internal air flow path and the external air flow path when the at least one removable heat tube heat exchanger is removed from the indirect air cooler.

2. The indirect air cooler according to claim 1, wherein the at least one removable heat tube heat exchanger is comprised in a panel slidably mounted in the indirect air cooler.

3. The indirect air cooler according to claim 1 comprising at least one adjustable opening baffle operable to maintain separation of the internal and external air flow paths when the removable heat tube heat exchanger is removed from the indirect air cooler.

4. The indirect air cooler according to claim 1, comprising a plurality of removable heat tube heat exchangers, each removable heat tube heat exchanger being comprised in a panel, wherein the panels are arranged in one or more rows.

5. The indirect air cooler according to claim 1, comprising a plurality of modules, wherein the internal air flow path is defined by a plurality of modules and/or the external air flow path is defined by a plurality of modules.

6. The indirect air cooler according to claim 1, comprising at least one controllable recirculation vent in the external air flow path, the at least one controllable recirculation vent being arranged to control recirculation of air from a portion of the external air flow path downstream of at least one heat tube heat exchanger to a portion of the external air flow path upstream of the at least one heat tube heat exchanger, wherein the portion of the external air flow path upstream of the at least one heat tube heat exchanger is a mixing chamber for mixing recirculated air with external air from outside the data centre.

7. The indirect air cooler according to claim 1, comprising a plurality of removable heat tube heat exchangers, wherein each removable heat tube heat exchanger is removable from the indirect air cooler without requiring removal of all of the other removable heat tube heat exchangers.

8. The indirect air cooler according to claim 1, comprising one or more controllable vents for admitting external air from the external air flow path into the internal air flow path.

9. A method of operating an indirect air cooler for a data centre, wherein the indirect air cooler defines:
    i) an internal air flow path configured to receive interior air from an interior of the data centre and to return the interior air to the interior of the data centre, and
    ii) an external air flow path configured to receive external air from an exterior of the data centre and to return the external air to the exterior of the data centre,
        wherein the indirect air cooler comprises a plurality heat tube heat exchangers for exchanging heat between the interior air and the exterior air, wherein at least one of the plurality of heat tube heat exchangers is removable, and wherein the indirect air cooler comprises a baffle configured to maintain separation between the internal air flow path and the external air flow path when the at least one removable heat tube heat exchanger is removed from the indirect air cooler
        wherein the method comprises removing a removable heat tube heat exchanger from the indirect air cooler and operating the baffle to maintain separation between the internal air flow path and the external air flow path.

10. The method according to claim 9 comprising:
operating the indirect air cooler in a first mode in which all of the plurality of heat tube heat exchangers are used to cool air flowing along the internal air flow path;
removing at least one removable heat tube heat exchanger from the indirect air cooler; and
operating the indirect air cooler in a second mode in which all of the remaining heat tube heat exchangers are used to cool air flowing along the internal air flow path.

11. The method according to claim 10 comprising:
inserting a replacement heat tube heat exchanger into the indirect air cooler; and
operating the indirect air cooler in a third mode in which all of the remaining heat tube heat exchangers and the replacement heat tube heat exchanger are used to cool air flowing along the internal air flow path.

12. The method of operating an indirect air cooler according to claim 9, wherein the indirect air cooler comprises one or more controllable vents for admitting external air from the external air flow path into the internal air flow path, wherein the method comprises operating the one or more controllable vents to admit a controlled amount of external air into the internal air flow path.

13. An indirect air cooling unit for cooling a data centre, wherein the indirect air cooling unit comprises a first air flow path, a second air flow path, and a plurality of heat tubes for transferring heat from air flowing along the first air flow path to air flowing along the second air flow path;
- wherein at least one of heat tubes is removable from the indirect air cooling unit, the at least one removable heat tube extending through an opening between the first air flow path and the second air flow path when present in the indirect air cooling unit;
- and wherein the indirect air cooling unit comprises an adjustable baffle for closing the opening when the at least one removable heat tube is removed from the indirect air cooling unit.

14. The indirect air cooling unit according to claim 13, wherein the at least one removable heat tube is comprised in a panel slidably mounted in the indirect air cooling unit.

15. The indirect air cooling unit according to claim 13, comprising a plurality of removable heat tube panels comprising the removable heat tubes, wherein the panels are arranged in one or more rows.

16. The indirect air cooling unit according to claim 13, comprising a plurality of modules, wherein the first air flow path is defined by a plurality of modules and/or the second air flow path is defined by a plurality of modules.

17. The indirect air cooling unit according to claim 13, comprising at least one controllable recirculation vent in the second air flow path, the at least one controllable recirculation vent being arranged to control recirculation of air from a portion of the second air flow path downstream of at least one heat tube to a portion of the second air flow path upstream of the at least one heat tube.

18. The indirect air cooling unit according to claim 13, wherein each removable heat tube is removable from the indirect air cooling unit without removing all of the other heat tubes.

19. A method of operating an indirect air cooling unit for a data centre, wherein the indirect air cooling unit comprises a first air flow path, a second air flow path, and a plurality of heat tubes for transferring heat from air flowing along the first air flow path to air flowing along the second air flow path,
- wherein at least one of heat tubes is removable from the indirect air cooling unit, the at least one removable heat tube extending through an opening between the first air flow path and the second air flow path when present in the indirect air cooling unit;
- and wherein the indirect air cooling unit comprises an adjustable baffle for closing the opening when the at least one removable heat tube is removed from the indirect air cooling unit;
- wherein the method comprises removing a removable heat tube from the indirect air cooler and operating the baffle to close the opening.

20. The method according to claim 19 comprising:
- operating the indirect air cooling unit in a first mode in which all of the plurality of heat tubes are used to cool air flowing along the first air flow path;
- removing at least one removable heat tube from the indirect air cooling unit; and
- operating the indirect air cooling unit in a second mode in which all of the remaining heat tubes are used to cool air flowing along the first air flow path.

21. The method of operating an indirect air cooler according to claim 20 comprising:
- inserting a replacement heat tube into the indirect air cooling unit; and
- operating the indirect air cooling unit in a third mode in which all of the remaining heat tubes and the replacement heat tube are used to cool air flowing along the first air flow path.

* * * * *